United States Patent
Waarts et al.

(10) Patent No.: US 6,411,323 B1
(45) Date of Patent: Jun. 25, 2002

(54) HIGH POWER MARKING SYSTEM ACHIEVED THROUGH POWER SCALING VIA MULTIPLEXING

(75) Inventors: Robert G. Waarts, Fremont; David F. Welch, Menlo Park, both of CA (US)

(73) Assignee: SDL, Inc., San Jose, CA (US)

( * ) Notice: Subject to any disclaimer, the term of this patent is extended or adjusted under 35 U.S.C. 154(b) by 0 days.

(21) Appl. No.: 09/732,477

(22) Filed: Dec. 7, 2000

Related U.S. Application Data

(62) Division of application No. 08/955,883, filed on Oct. 21, 1997, now Pat. No. 6,212,310.
(60) Provisional application No. 60/028,604, filed on Oct. 22, 1996.

(51) Int. Cl.[7] .............................. B41J 27/00; G02B 6/34
(52) U.S. Cl. .......................... 347/241; 347/256; 385/37
(58) Field of Search ................................ 347/171, 197, 347/222, 241, 256, 239; 385/24, 31, 37, 43, 123; 359/569; 372/50

(56) References Cited

U.S. PATENT DOCUMENTS

| | | | |
|---|---|---|---|
| 5,121,460 A | 6/1992 | Tumminelli et al. | 385/126 |
| 5,177,803 A * | 1/1993 | Newhouse et al. | 385/43 |
| 5,185,826 A | 2/1993 | Delavaux | 385/24 |
| 5,187,760 A | 2/1993 | Huber | 385/37 |
| 5,224,116 A | 6/1993 | Whitley et al. | 372/71 |
| 5,241,414 A | 8/1993 | Giles et al. | 359/341 |
| 5,268,910 A | 12/1993 | Huber | 372/6 |
| 5,287,216 A | 2/1994 | Chirravuri et al. | 359/341 |
| 5,291,501 A | 3/1994 | Hanna | 372/6 |
| 5,311,525 A | 5/1994 | Pantell et al. | 372/6 |
| 5,315,436 A * | 5/1994 | Lowenhar et al. | 359/569 |
| 5,323,404 A | 6/1994 | Grubb | 372/6 |
| 5,473,622 A | 12/1995 | Grubb | 372/6 |
| 5,500,764 A | 3/1996 | Armitage et al. | 359/341 |
| 5,530,710 A | 6/1996 | Grubb | 372/6 |
| 5,564,832 A | 10/1996 | Ball et al. | 374/161 |
| 5,566,196 A | 10/1996 | Scifres | 372/6 |
| 5,625,403 A * | 4/1997 | Hazman | 347/239 |
| 5,666,447 A * | 9/1997 | Chuang et al. | 385/31 |
| 5,799,029 A * | 8/1998 | Rossi et al. | 372/50 |

OTHER PUBLICATIONS

Strasser et al., entitled "Reflective–mode conversion with UV–induced phase gratings in two–mode Fiber" Conference on Optical Fiber Communications, Technical Digest Conference Devision, 1997 OSA Technical Digest Series, vol. 6, Feb. 16–21, 1997, Dallas, Texas, pp. 348–349.

H.Zellmer et al, entitled "High–power cw neodymium- –doped fiber laser operating at 9.2 W. with high beam quality", Optics Letters, vol. 20, No. 6, Mar. 15, 1995, pp. 578–580.

Grubb et al., entitled 1.3 micron cascaded Raman amplifier in Germanosilicate Fibers, Paper PD3, Optical Amplifiers and Their Applications, Tech. Digest, Optical Society of America, Wash. DC, (1993).

* cited by examiner

*Primary Examiner*—N. Le
*Assistant Examiner*—Hai C. Pham
(74) *Attorney, Agent, or Firm*—Allen, Dyer, Doppelt, Milbrath & Gilchrist, P.A.

(57) ABSTRACT

Power scaling by multiplexing multiple fiber gain sources with different wave-lengths is useful in printing applications requiring higher optical powers to perform the printing function, such as through thermal inducement in thermal ablation, thermal fusion, thermal diffusion or thermal transfer. A marking system is disclosed using a plurality of laser sources operating at different wavelengths with their respective outputs coupled into a respective single mode fiber. At least one WDM combiner is coupled to receive and combine the laser source outputs into a single output. The combined power single output provides sufficient power intensity to induce thermal marking on a marking medium.

15 Claims, 13 Drawing Sheets

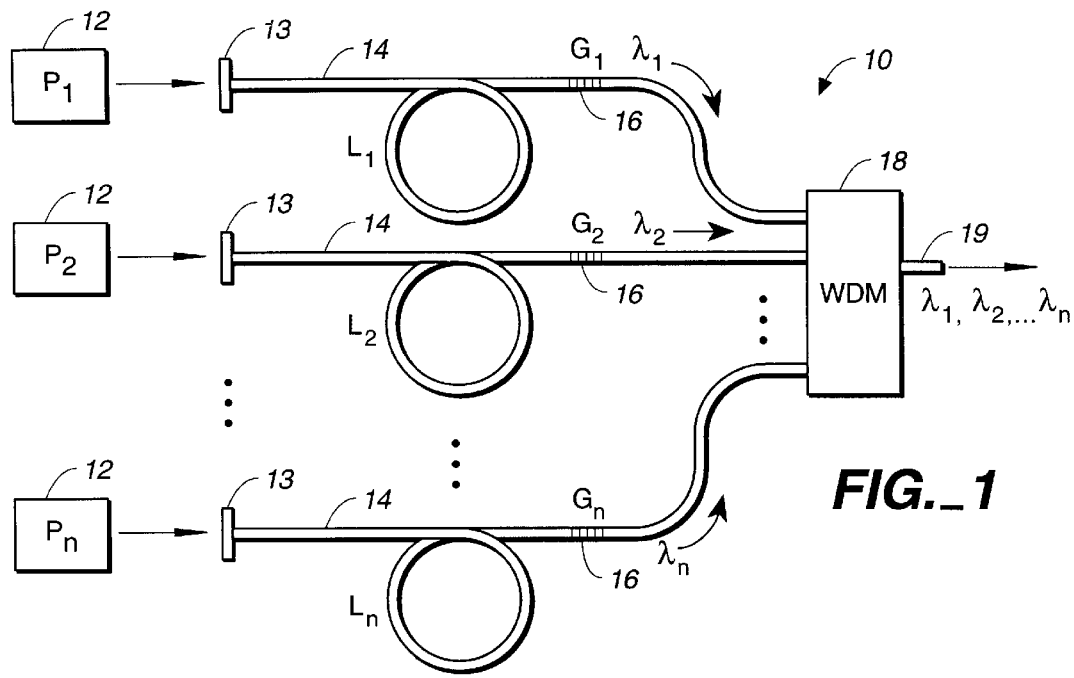
FIG._1
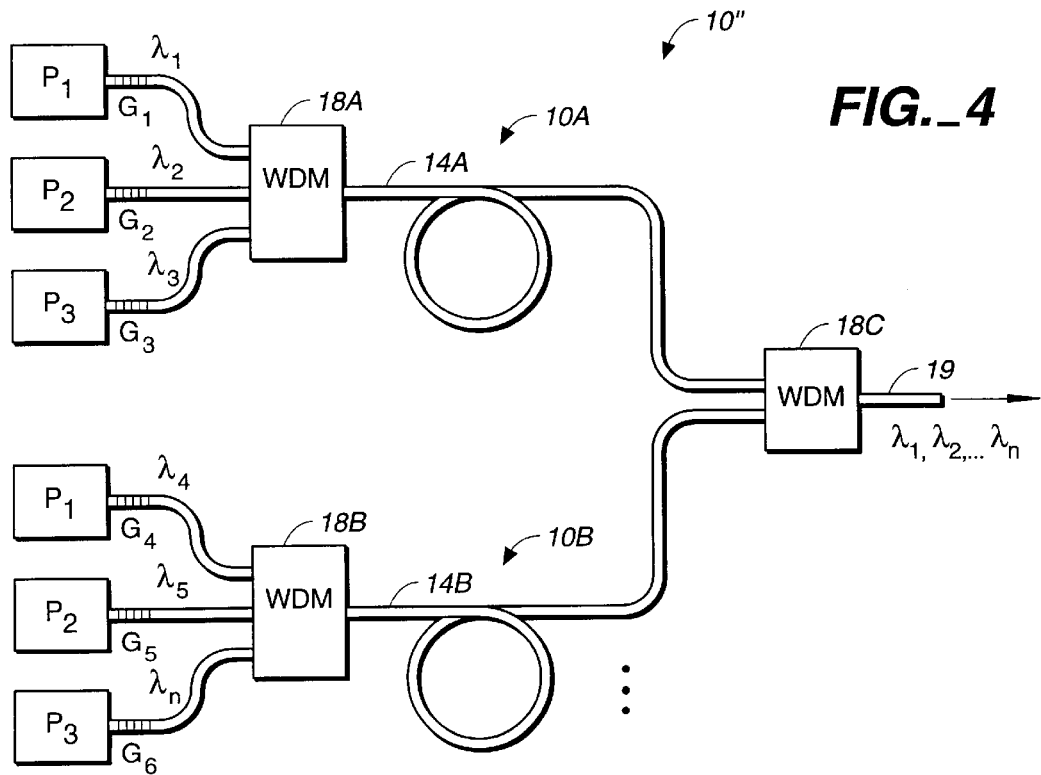
FIG._4

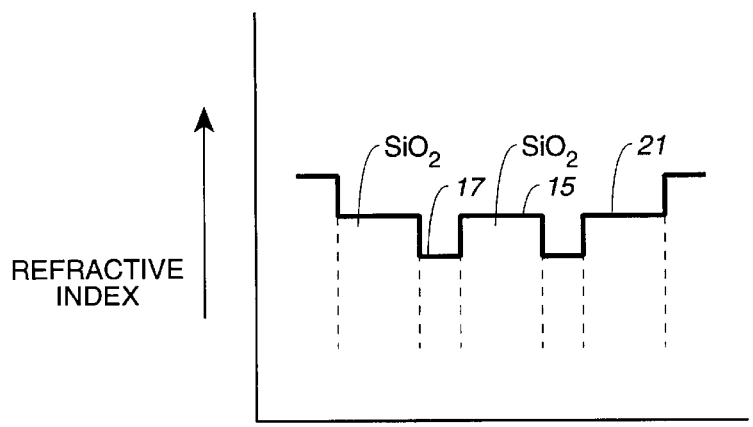
FIG._2
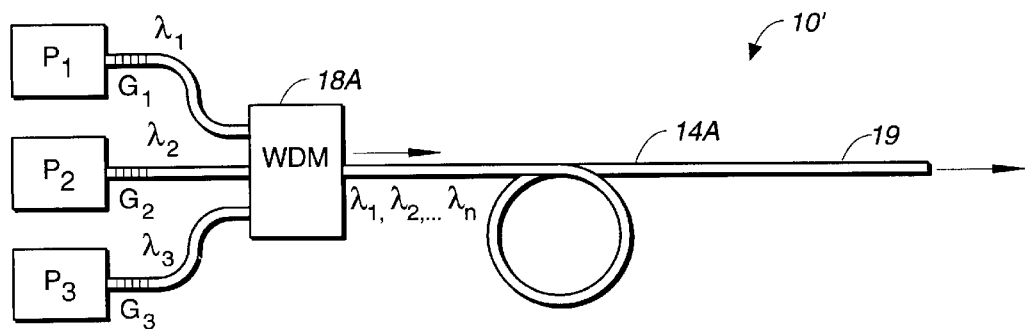
FIG._3
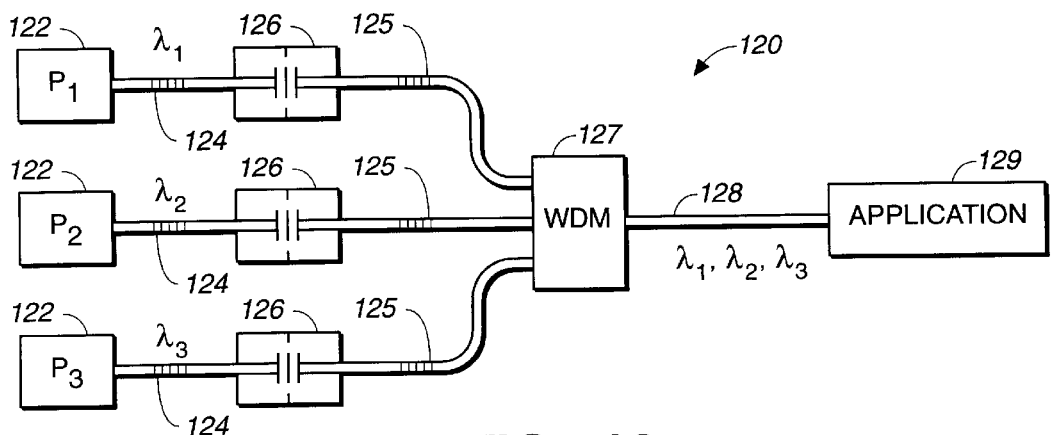
FIG._10

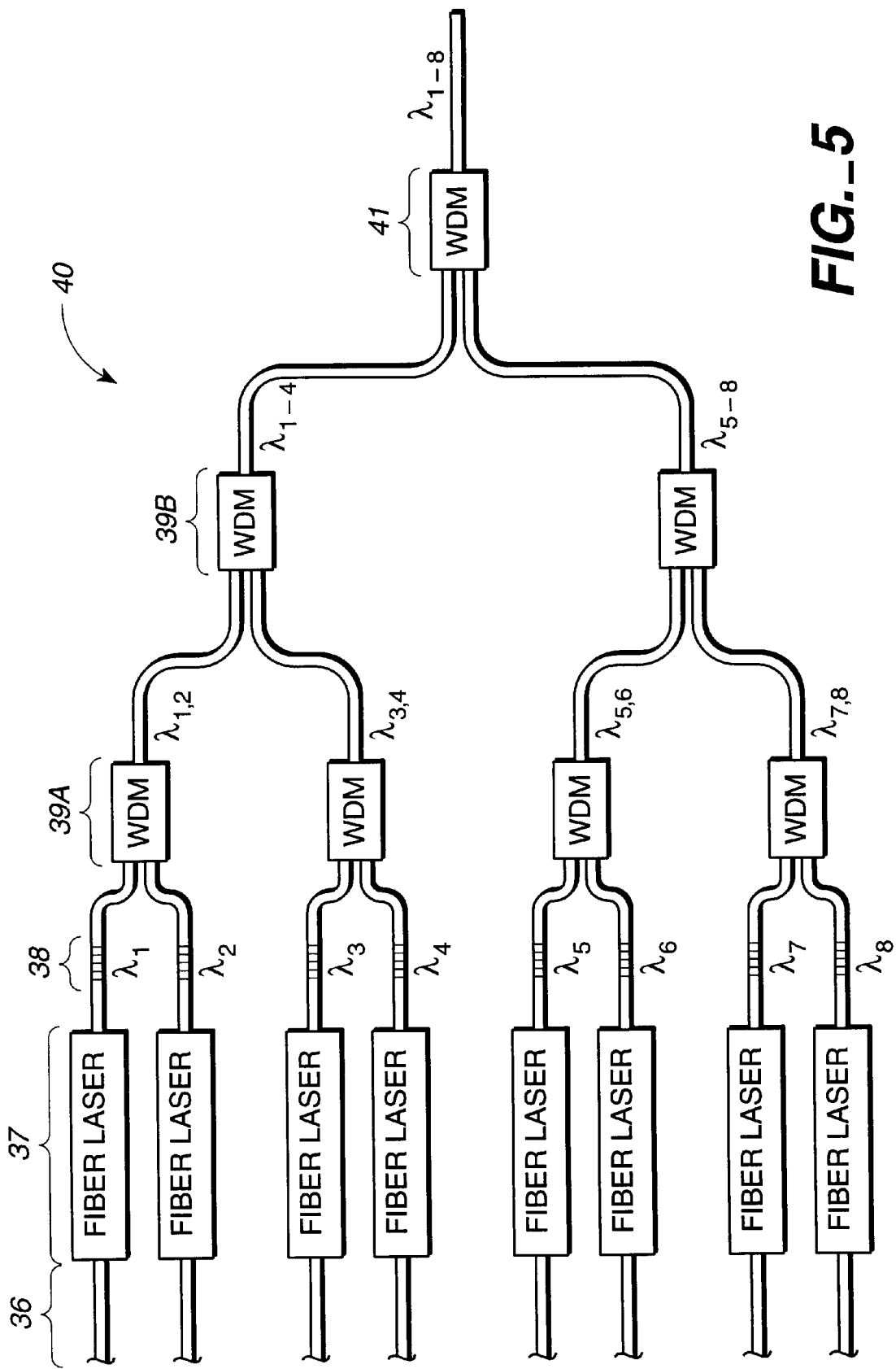
FIG._5

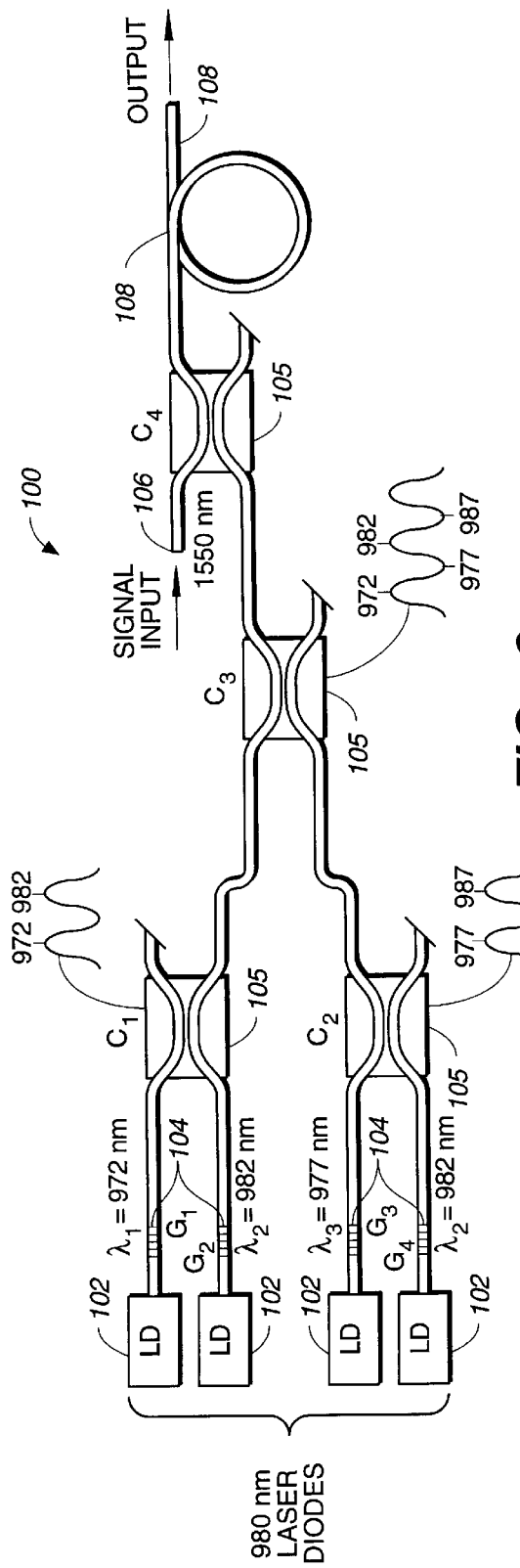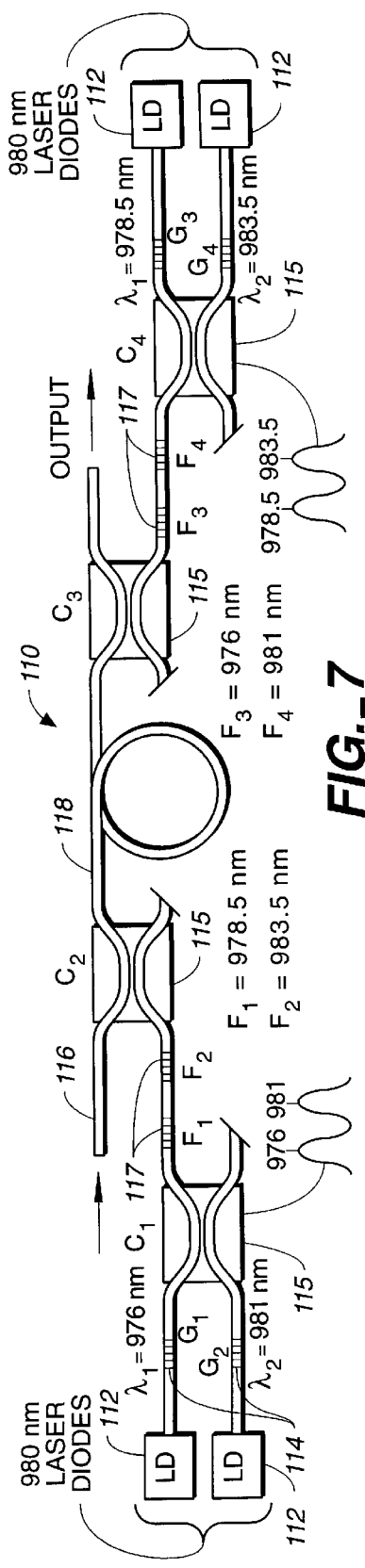

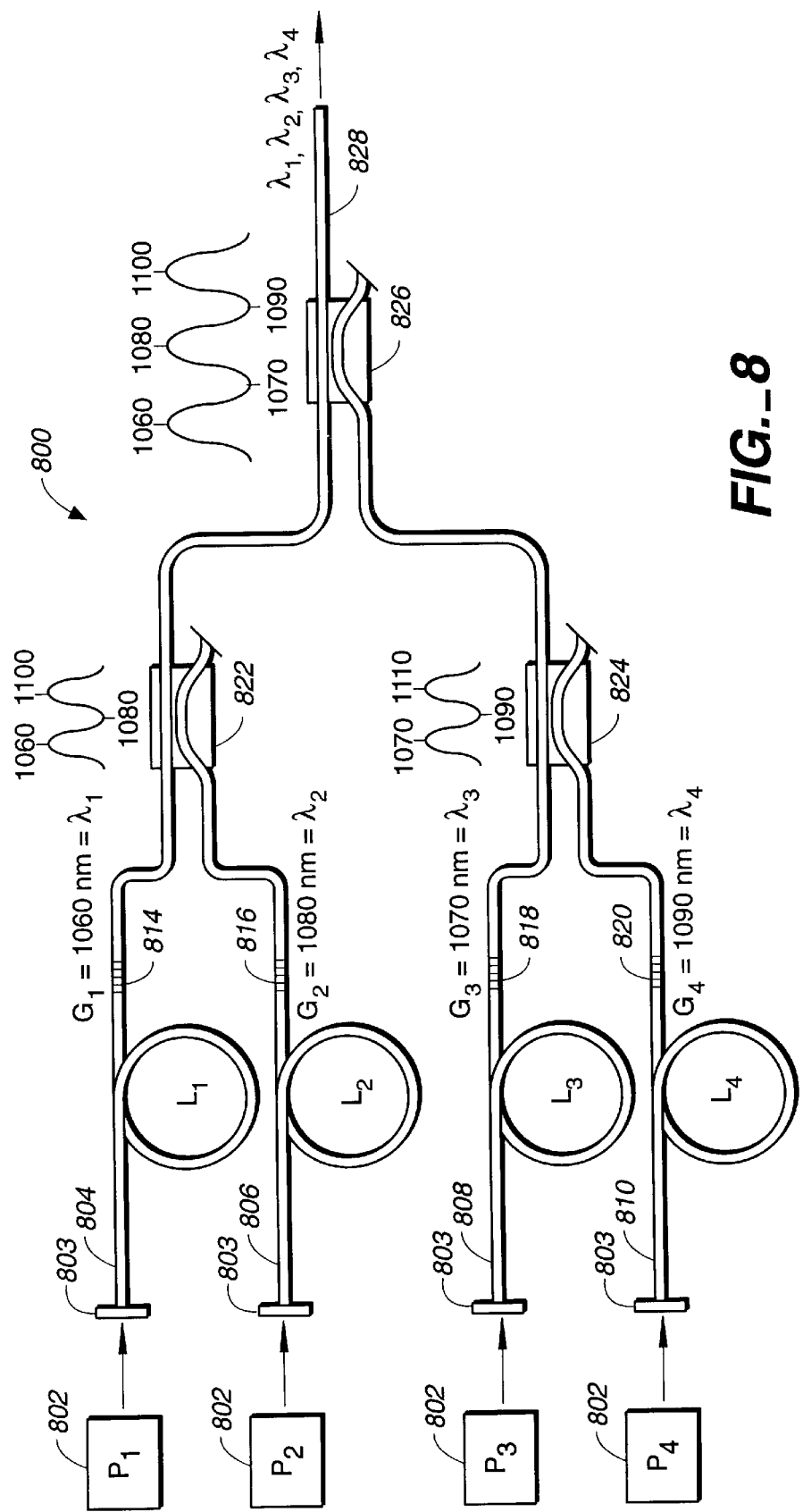
FIG._8

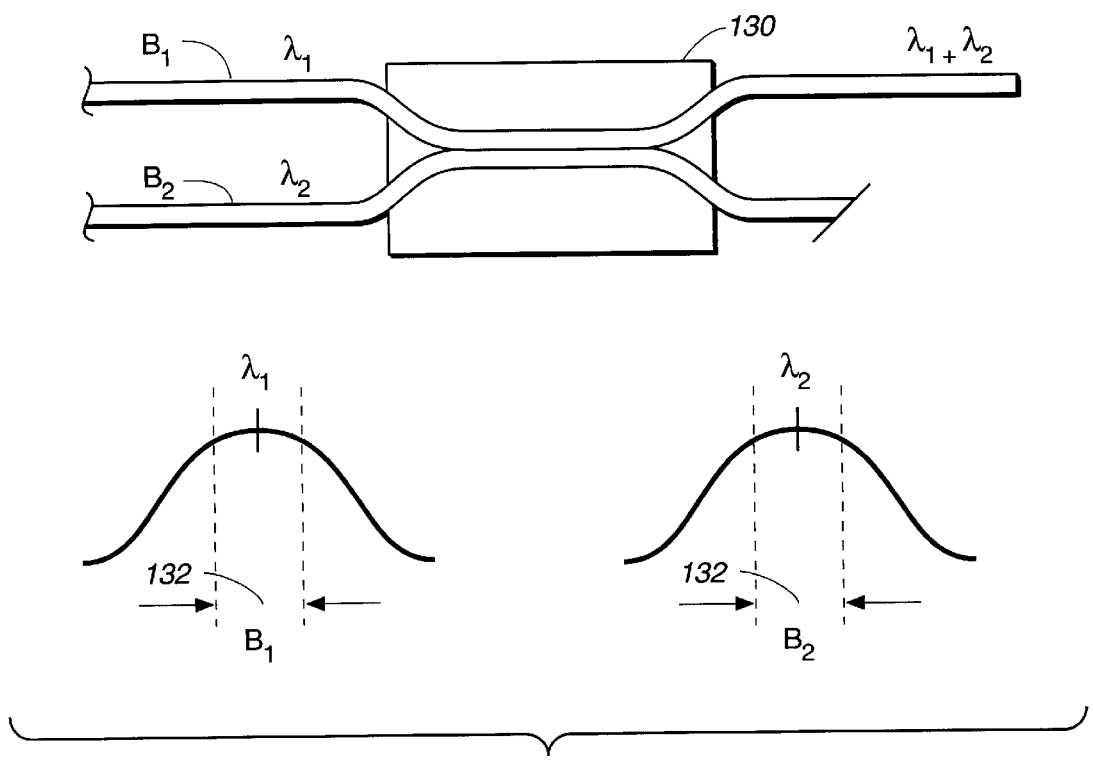
FIG._9
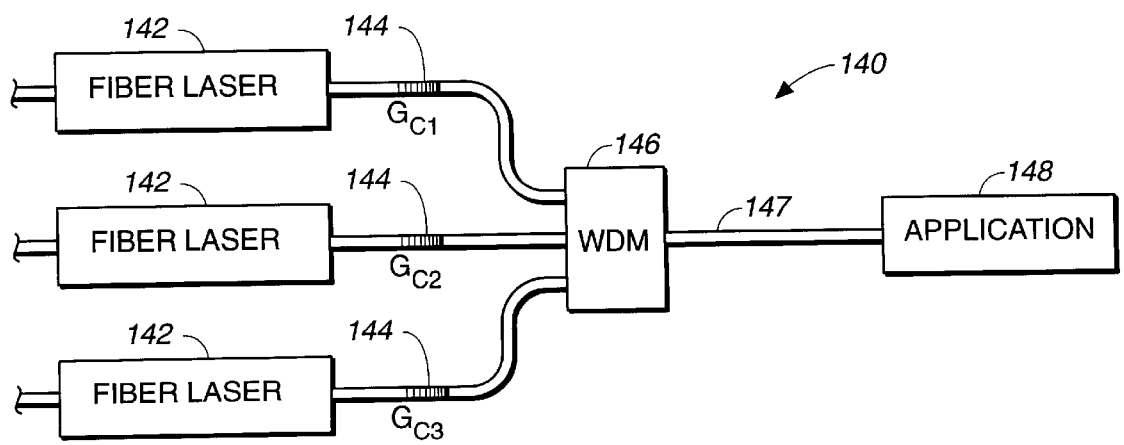
FIG._11

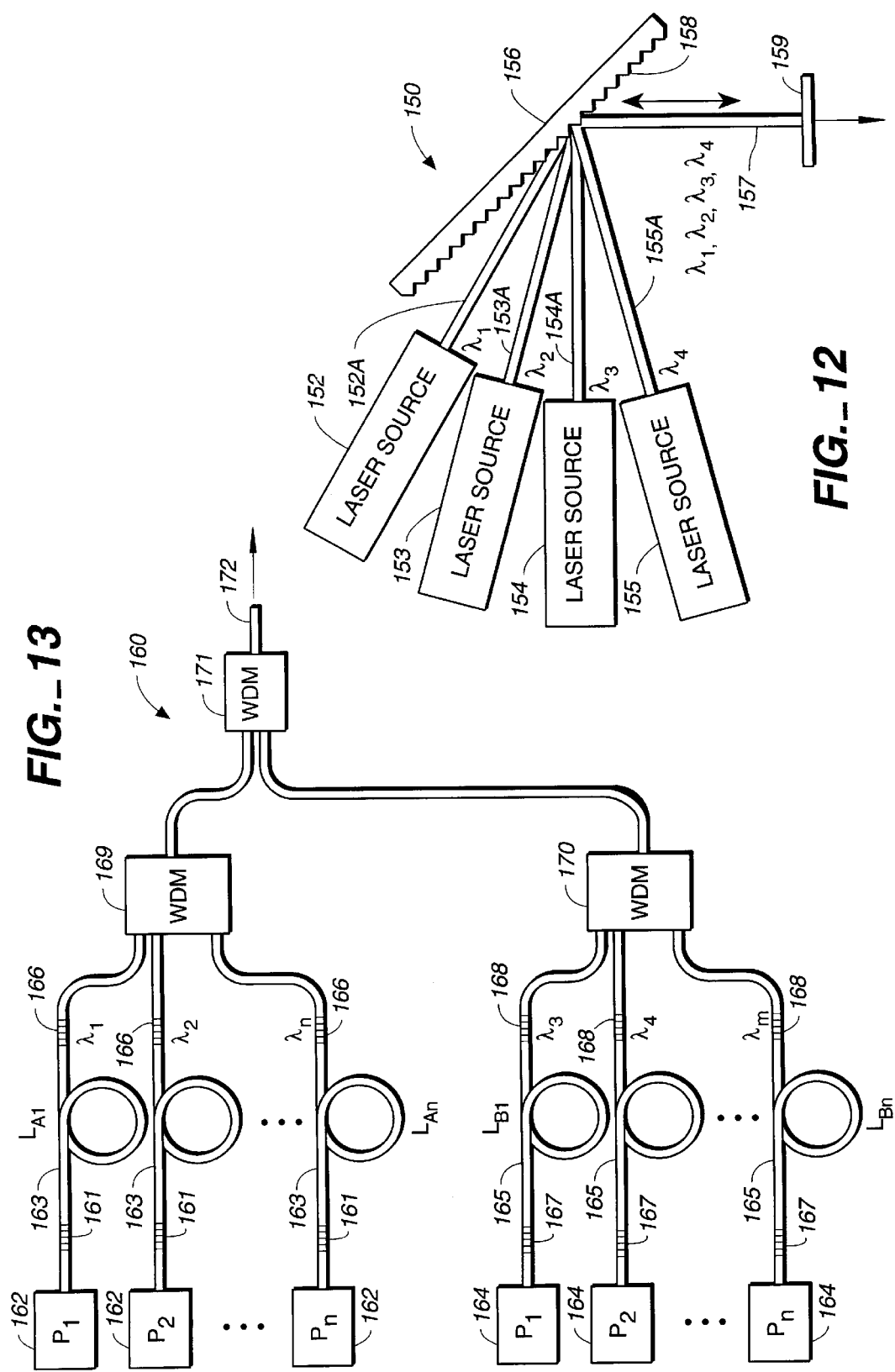

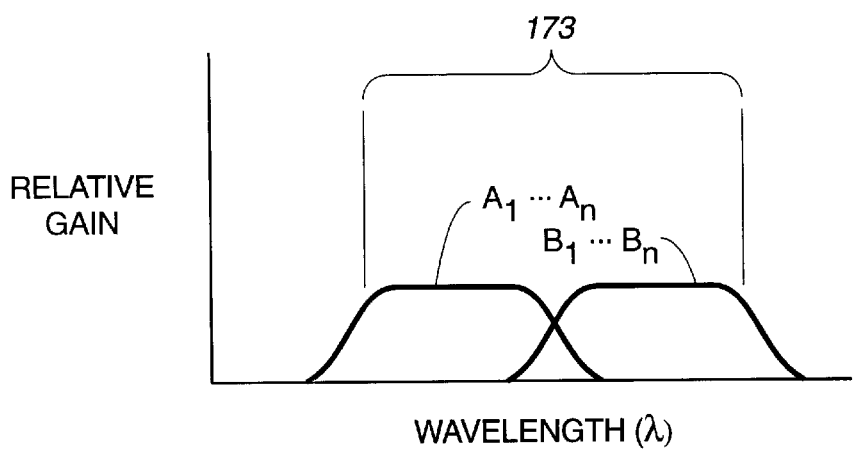
FIG._14
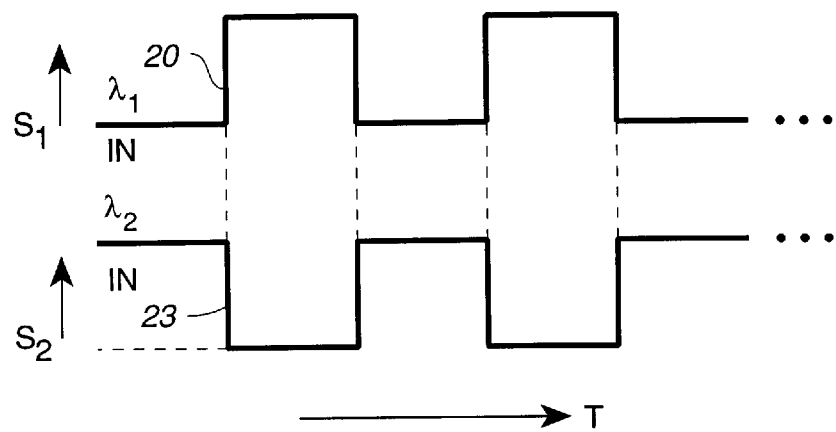
FIG._19A
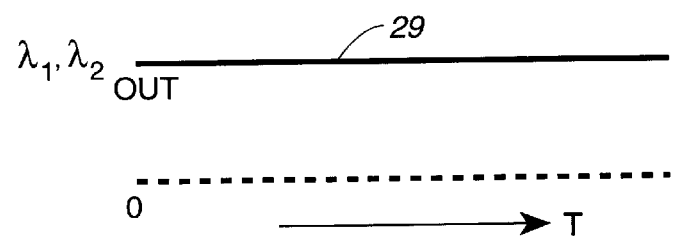
FIG._19B

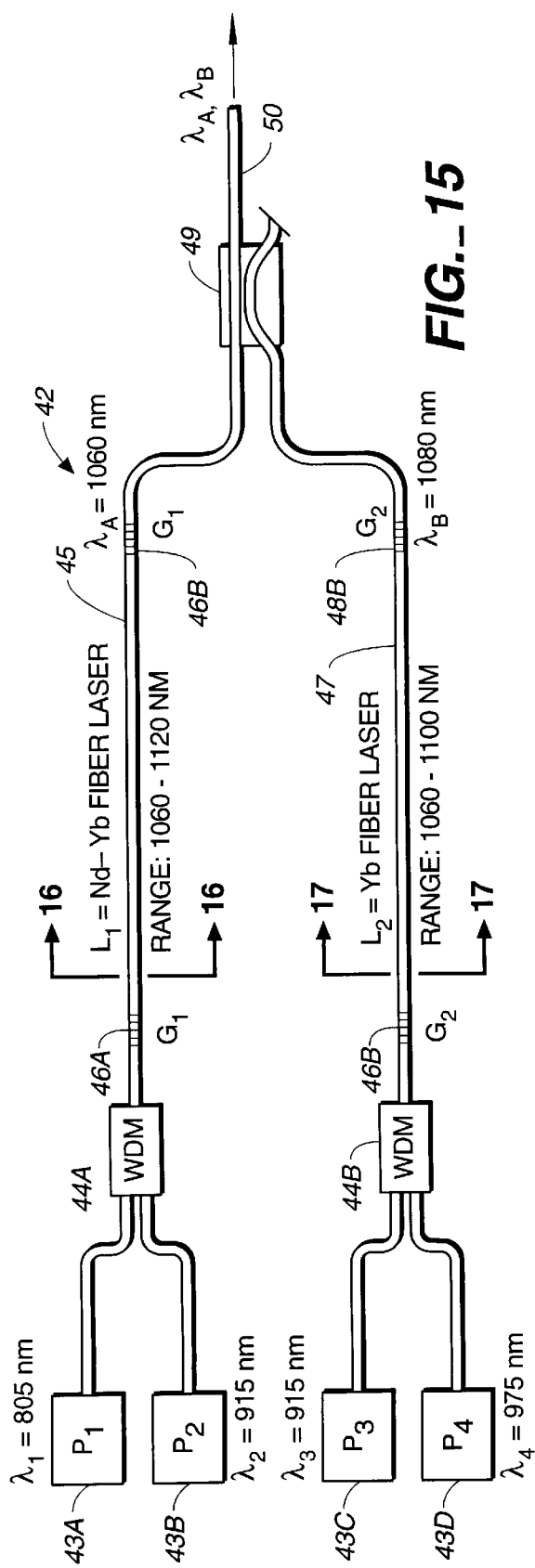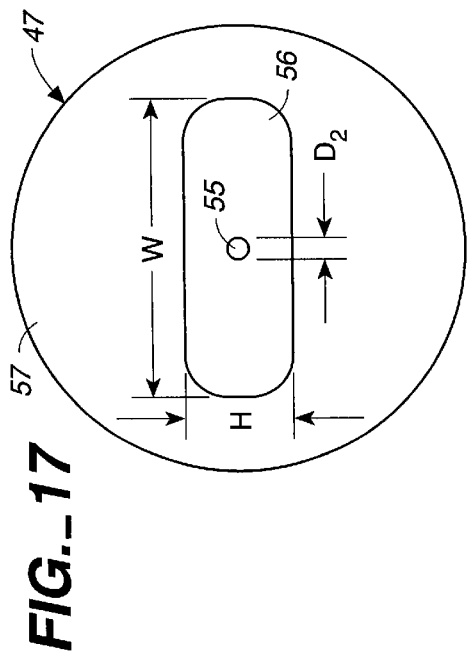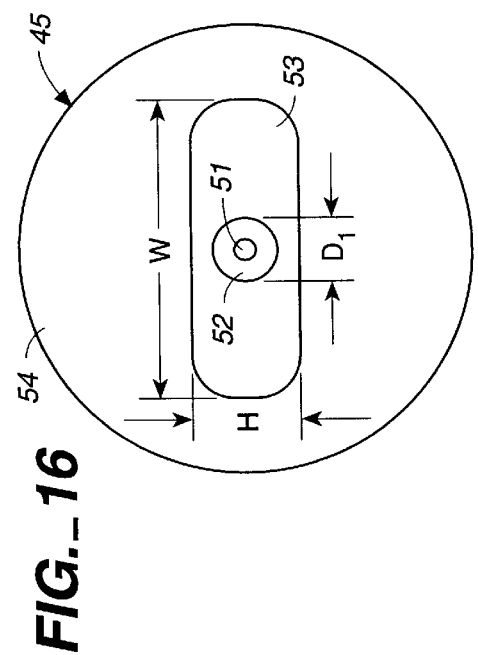
FIG._15
FIG._17
FIG._16

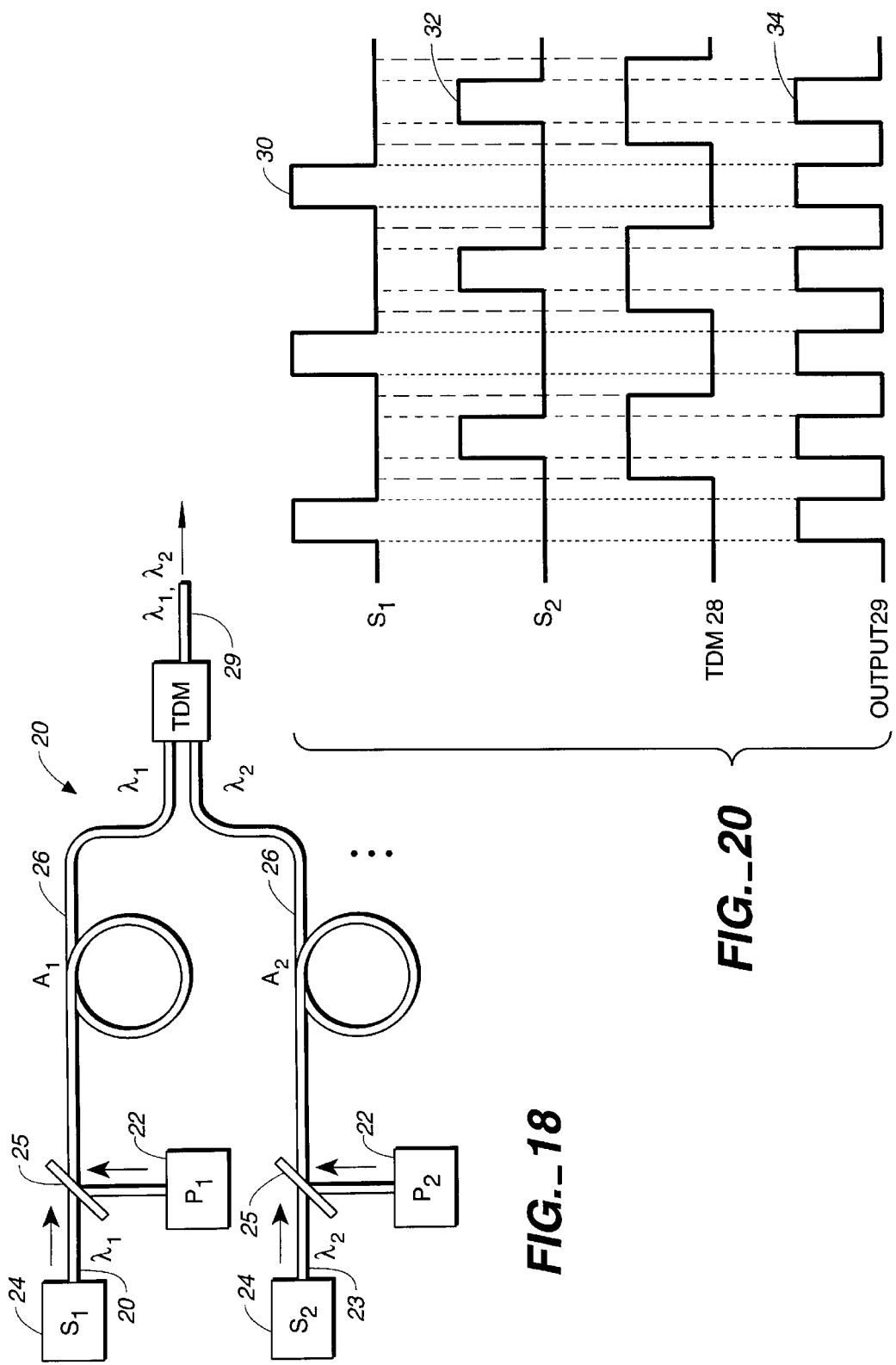
FIG._18
FIG._20

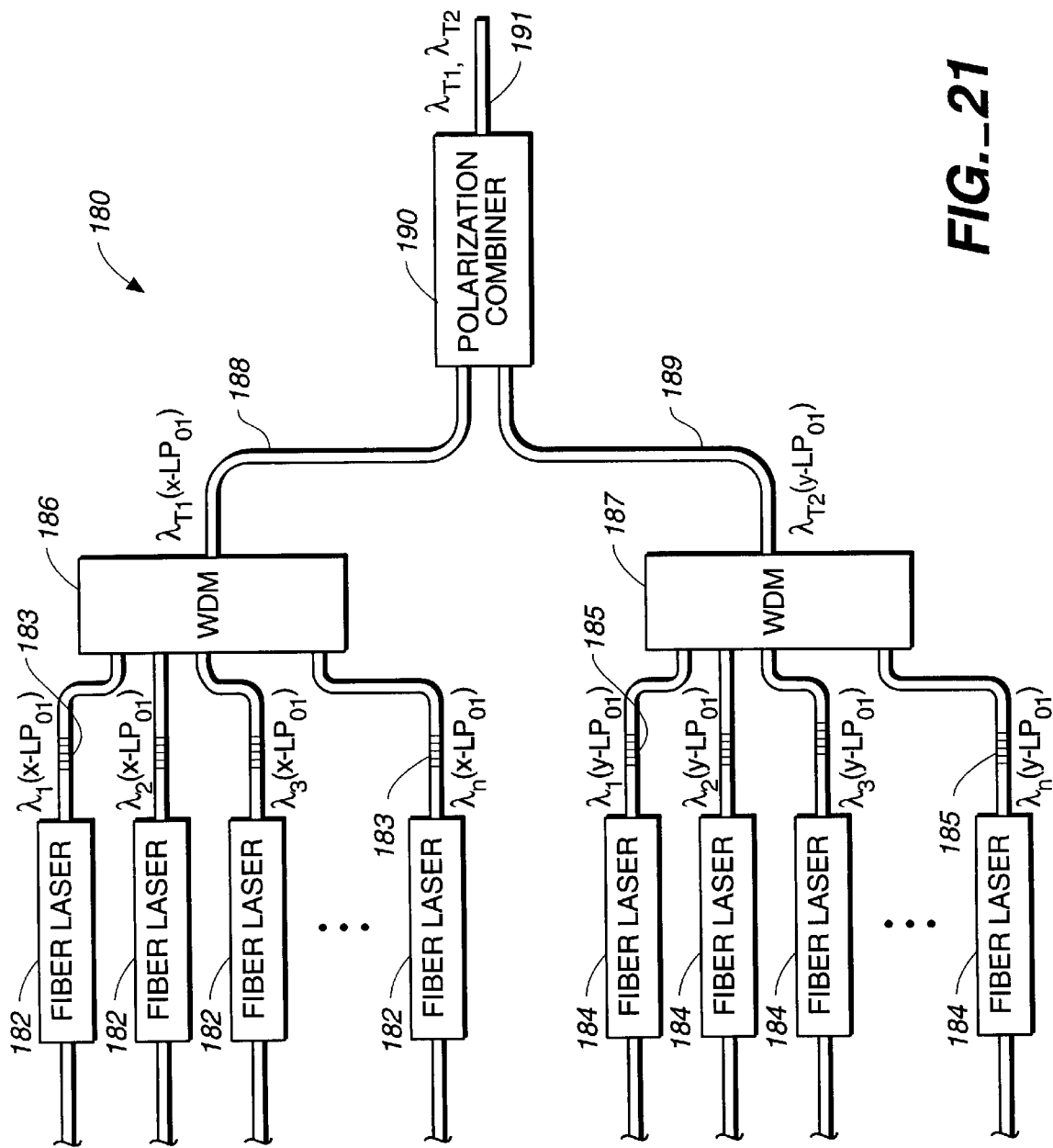
FIG._21

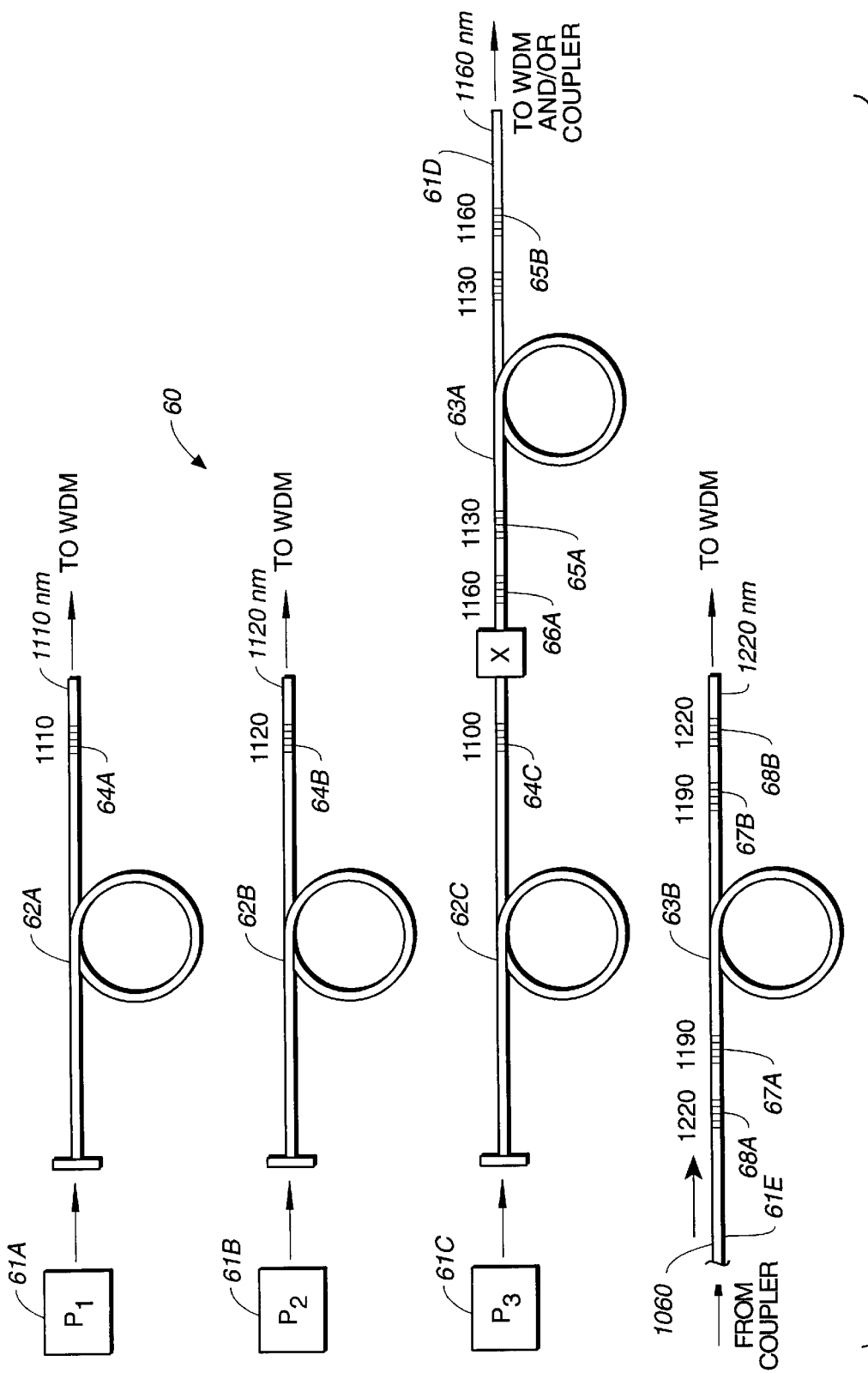
FIG._22

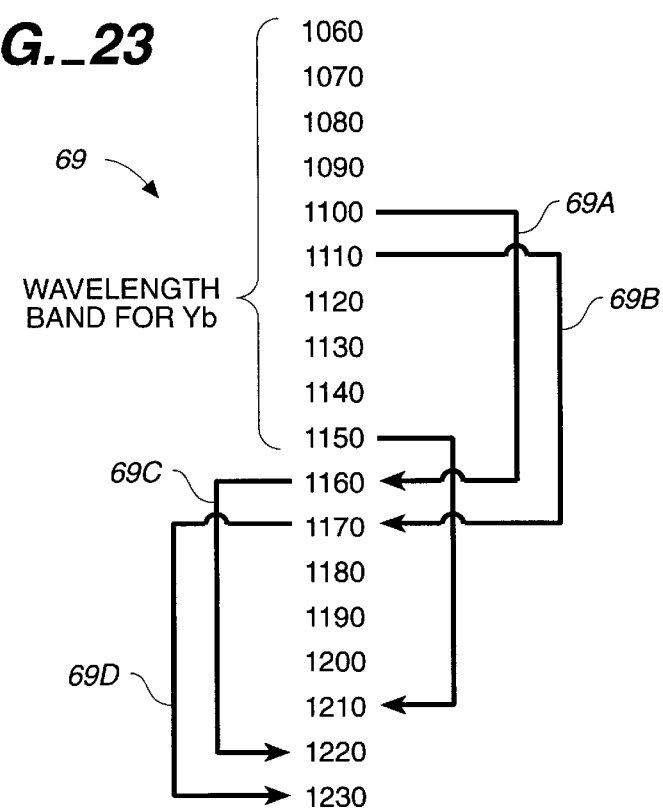
FIG._23
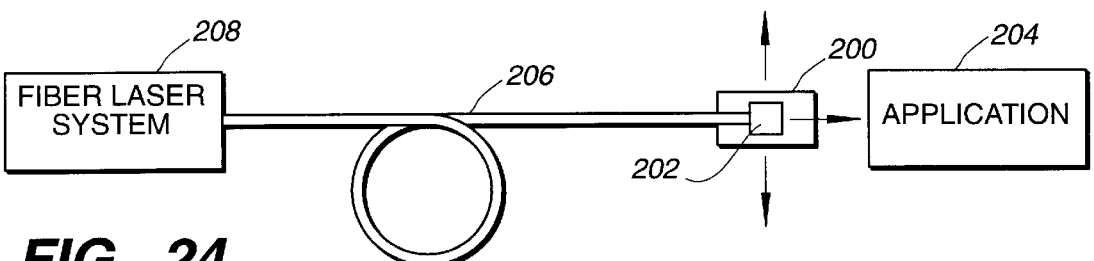
FIG._24
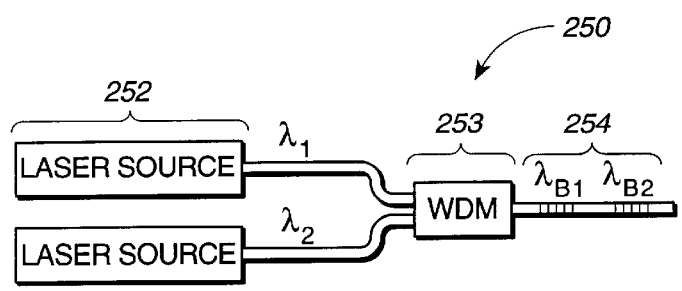
FIG._25

HIGH POWER MARKING SYSTEM ACHIEVED THROUGH POWER SCALING VIA MULTIPLEXING

CROSS REFERENCE TO RELATED APPLICATION

This application is a divisional of patent application, Ser. No. 08/955,883, filed Oct. 21, 1997 now U.S. Pat. No. 6,212,310 which claims priority benefits of prior filed copending provisional application, Serial No. 60/028,604, filed Oct. 22, 1996, which is incorporated herein by reference thereto.

FIELD OF THE INVENTION

This invention relates generally to scaling power of fiber light sources for coupling high optical output power to optical devices and applications and, more particularly, to such high power fiber gain media systems for use in marking systems such as through thermal marking on a marking medium.

BACKGROUND OF THE INVENTION

Due to the development of reliable high power laser diodes and diode arrays, it is now possible to achieve higher power from all types of solid state lasers. Typical solid state lasers, such as Nd:YAG lasers, typically operate over a fairly narrow wavelength determined by a narrow band of atomic transitions. They are also limited in their temporal operation, e.g., their pulse modulation is limited. On the other hand, fiber gain media, such as rare earth doped fiber gain sources, can be operated comparatively over a wide wavelength band. As an example, Yb doped fiber sources are operative over a wavelength range of about 1060 nm to 1150 nm depending on a number of design parameters including fiber length and the application of wavelength-selective feedback. Also, because of the high gain of the fibers, they may be operated as amplifiers providing precise control over the temporal output of the laser source. Thus, rare-earth doped fiber gain sources, versus pumped solid state lasers, may be controlled in their temporal output over a wide range of pulse lengths and modulation rates.

The use of a single mode fiber for linear power scaling, i.e., to increase or upscale the optical power, is better because of forced laser oscillation in single transverse mode. Also, fiber lasers offer a low cost, easily produced power source at selected wavelength operation for telecommunications, printing, signal detection and medical applications. The upper limits of power scaling in conventional single clad, rare earth doped monomode fibers is limited because of the numerical aperture (NA) and core size incompatibility of these single mode fibers with the beam parameters and NA of high power laser diodes and laser diode arrays. As outlined in the paper of H. Zellmer et al., entitled, "High-Power CW Neodymium Doped Fiber Laser Operating at 9.2 W With High Beam Quality", *OPTICS LETTERS*, Vol. 20(6), pp. 578–580, Mar. 15, 1995, to scale the pump power, a larger fiber core diameter that is adapted to the emitter dimensions of the high power laser diode or diode array is used. However, reduced beam quality results because an increased fiber diameter permits multimode operation.

To overcome this problem, specially configured double clad fibers have been developed where the pump radiation is launched directly into a multimode waveguide having an inner cladding surrounding a single mode core, i.e., a pump core or inner cladding which has a larger NA and large cross area which is compatible with the beam parameters of high power laser diodes or arrays. A double clad fiber, for example, comprises a single mode core, doped with a rare earth such as Yb, Nd, Er or other rare earth dopants, or combination of such dopants, such as, Er:Yb, surrounded by an inner cladding of lower refractive index material compared to the core. High output power of the fiber gain source is achieved by launching multimode pump light into the pump core of the fiber having a wavelength corresponding to the pump absorption bandwidth of the rare earth dopant in the fiber core. The pump light propagates in the multimode inner cladding and is absorbed into the active monomode core over the length of the fiber. The multimode inner cladding permits the multi-traversing of the core by the light with a wavelength corresponding to excited emission state of the doping atoms in the pump core for bring about stimulated transition of the excited atoms to a lower energy level resulting in gain for signal amplification. As a result, multimode pump light from a high power diode laser array is converted into single transverse mode power output of several watts from a single mode core of the double clad fiber. For example, for a typical 100 $\mu$m by 300 $\mu$m multimode pump light with a 100 $\mu$m by 300 $\mu$m diameter beam and a 0.47 NA, the beam may be efficiently coupled to the inner pump cladding of the fiber. The output from the fiber is a single mode beam with a 10 $\mu$m diameter and a 0.1 NA. This is about a three order increase in coupled brightness.

These double clad fiber gain sources can be operated as fiber amplifiers or fiber lasers. The laser configuration employs feedback means such as in the form of a pair of reflectors or fiber Bragg gratings making it a relatively simple structure, but is limited in most cases to cw operation. The amplifier configuration has the advantage of accurate control of the temporal output of the fiber source. The output optical power of either the laser or amplifier configuration is limited by the amount of pump light that may be injected into the fiber, the optical-to-optical conversion efficiency, and the maximum power achievable before the onset of fiber degradation. For a given rare earth dopant, the theoretical conversion efficiency is around 40% to 70% and, in actual practice, similar levels of conversion efficiency have been achieved.

The output power from a single fiber gain source can be increased by pumping the fiber source from both ends or at multiple points along the length of the fiber. Also, the output power from a single fiber gain source can be increased by increasing the size of the fiber and its numerical aperture (NA). In practice, however, the size of the fiber is limited to a diameter of several 100 $\mu$mm and its NA is approximately 0.45. The NA is limited by availability of suitable polymers that can be employed for the outer cladding of the fiber. Of course, the output power of the fiber gain source with a given input aperture and NA can be increased by increasing the output power and brightness of the pump source for pumping the fiber medium. Typically, this can be accomplished by the use of multimode and multi-emitter semiconductor laser diode arrays or laser bars as pumping sources. The format and brightness of the array or bar should be optimally matched to the etendue of the inner cladding of the fiber. Theoretically, the brightness of the source should not be detrimentally affected in accomplishing this reformatting but, in practice, the brightness is significantly lower. As an example, a typical fiber coupled laser bar providing 17 W of cw power may be coupled to a fiber pump core having 170 $\mu$m by 330 $\mu$m rectangular cross-section aperture and an NA of 0.45.

It is known to scale power in a fiber source by injecting pump light in both ends of the fiber source, such as exemplified in the patent to Huber U.S. Pat. No. 5,268,910. Also, it is known to scale to even higher output powers in fiber sources by increasing either the pump power, such as higher power semiconductor pump sources or using multiple semiconductor pump sources, or by increasing the pump efficiency, such as by decentering the active core of a double clad fiber relative to the surrounding pump (inner cladding) core or use longer fibers with periodic fiber bends to convert, in both of these cases, more of the multimodes in the pump core. See, for example, H. Zellmer at al., supra; the patent to Chirravuri et al. U.S. Pat. No. 5,287,216; and the patent to Delavaux U.S. Pat. No. 5,185,826. Moreover, it has been previously disclosed in work published by Lew Goldberg at al. to scale output power by connecting in series a plurality of fiber gain source stages, such as double clad fiber amplifiers. In this case, multiple fiber sources are coupled in series, and the power from the first fiber source is coupled into the second fiber source and so. Each fiber source may be pumped from one or both ends, such as through the employment of dichroic mirrors which separate between pump light, which is typically around 808 nm or 915 nm, and the output wavelength, which typically around 1.06 $\mu$m or 1.55 $\mu$m. However, there are two disadvantages in this type of scale power system. First, the power levels in cores of fiber sources down-line in the system may become so high causing fiber core degradation. Second, the level of coupling losses between fiber gain source stages will limit the number of stages that can be effectively coupled together. For example, assuming 20% coupling losses between multiple source stages and 10 watt single stage fiber sources, a net power gain cannot be increased above 50 watts of output power because the coupling loss will equal the power achieved in any subsequently coupled source stages. Of course, improvements in coupling efficiency between stages will result in higher power levels, but there are presently limits on how high of a coupling efficiency will be reasonably achieved in stage coupling.

Another possible approach for scaling power in serially connected fiber gain source stages is side pumping each fiber source periodically along the length of the stage fiber. This technique is illustrated for single mode fibers in the patent to Whitley et al. U.S. Pat. No. 5,224,116.

A further approach for scaling power is employing polarization beam multiplexing (PBM) to combine a plurality of beams into a single output having different polarization modes as long as they are orthogonally polarized. This principle is known in the art, such as evident from the patent to Pantell et al. U.S. Pat. No. 5,311,525 wherein in column 14, there is a discussion of optical devices for coupling of optical energy or radiation between two different sets of polarization modes.

A still further approach for increasing power to provide a high power fiber amplifier is the utilization of a plurality of pump double clad fiber lasers operating at pump wavelengths within the pump band of the fiber amplifier as discussed in the patent to Huber U.S. Pat. No. 5,187,760 and disclosed in FIGS. 7 and 10 and in column 8, lines 29–42 and lines 48–54.

However, there is a need to enhance scaling of power via multiple fiber medium sources of different wavelengths and how this can be accomplished within the limited gain band of such sources, which is the subject of this application.

While improvements in output power can be achieved by improving the optical coupling and formatting between the laser diode array or bar sources and the input of the optical fiber media or by providing higher brightness of such laser diode pump sources or a combination thereof, it would also be advantageous to further improve the power scaling of these fiber gain medium sources, particularly double clad fiber sources, employing utilizing existing semiconductor pump sources and fiber coupling technology.

It is an object of this invention to provide optical gain media systems that provides scaling to high optical output powers, such as several tens to hundreds of watts of output power.

It is another object of this invention to produce optical power scaling system through wavelength division multiplexing (WDM), time domain multiplexing (TDM) and/or polarization beam multiplexing (PBM).

It is a further object of this invention to provide optical gain media systems that provides scaling to high optical output powers for use in marking systems such as in the case of induce thermal marking on a marking medium.

SUMMARY OF THE INVENTION

According to this invention, a marking system is provided using a plurality of laser sources operating at different wavelengths with their respective outputs coupled into a respective single mode fiber. At least one WDM combiner is coupled to receive and combine said laser source outputs into a single output. The combined power single output provides sufficient power intensity to induce thermal marking on a marking medium.

A pumped semiconductor or fiber gain sources with different wavelengths of operation are enhanced in the number of added pump sources through the fruition of different wavelength fiber gratings, one relative to each pump source providing a plurality of pump lights wavelength all within the gain bandwidth of the semiconductor gain sources or within the absorption bandwidth of the rare earth dopant or dopants employed in the pumped fiber sources. The outputs of the multiple wavelength sources are then combined employing wavelength division multiplexing (WDM) producing a high power output beam within tens to hundreds of watts of power. Further, enhanced WDM coupling can be achieved with the use of fused taper couplers. Coupling with these types of couplers permits efficient coupling of light of different wavelengths and can be adapted to couple light within about ±10% of peak transmission wavelengths in pairs of coupled fiber laser sources with paired outputs of coupled pairs coupled via subsequent fused taper couplers adapted to have peak transmission wavelength bands (±10%) of previously combined wavelength outputs from upstream or previous coupled pairs of fiber laser sources. These high power sources have high adaptability and acceptance for use in applications where wavelength(s) of output is of less importance, such as in printing systems, such as thermal or xerographic printing, or in material processing involving thermal treatment or marking, such as metal cutting and drilling, or marking such as intelligence (e.g. alpha-numeric or graphic information) on or in a surface, or in surgery such as in tissue removal. In the case where such power sources are employed in amplification of telecommunication signals, such as 1.3 $\mu$m or 1.55 $\mu$m communication systems, the power output of these pumping systems eliminates the need for frequent repeaters. Moreover, pumping can be accomplished at opposite ends of the fiber amplifier, i.e., counter propagating WDM coupled pump sources, to increase amplification and using inline wavelength filters to isolate the counter-propagating pump fiber laser sources from one another.

BRIEF DESCRIPTION OF THE DRAWINGS

FIG. 1 is schematic view of an embodiment for power scaling of this invention utilizig the bandwidth of multiple fiber laser sources for achieving different output wavelengths that are WDM combined.

FIG. 2 is refractive index cross sectional representation of a monomode fiber preferred for high power transmission in the hundreds of watts to several kilowatts range.

FIG. 3 is schematic view of a modified form of the embodiment shown in FIG. 1 for power scaling of this invention where a plurality of pump sources are WDM combined to produce a single output to pump a fiber amplifier.

FIG. 4 is a schematic view of an extended form of the application shown in FIG. 3 where sets of a plurality of pump sources are WDM combined to pump respective fiber amplifiers which are WDM combined to produce a single output.

FIG. 5 is schematic view of a basic embodiment for WDM combining of multiple fiber laser sources for power scaling utilizing the bandwidth of multiple fiber laser sources via frequency selecting fiber gratings.

FIG. 6 is a first detailed example of an embodiment of this invention relative to the use of fused couplers as WDM devices.

FIG. 7 is a second detailed example of an embodiment of this invention relative to the use of fused couplers as WDM devices.

FIG. 8 is a detailed example of an embodiment of this invention for power scaling of this invention utilizing the bandwidth of multiple fiber laser sources.

FIG. 9 is a schematic view of a WDM combiner in the form of a fused biconical coupler for use with this invention that accepts a limited bandwidth of wavelengths from multiple laser sources.

FIG. 10 is schematic view of a quick disconnect scheme that may be utilized in connection with any of the embodiments of this invention.

FIG. 11 is a schematic view of another embodiment for power scaling of this invention utilizing the bandwidth of multiple fiber laser sources in combination with chirped gratings.

FIG. 12 a schematic view of a WDM combiner in the form of a grating reflector.

FIG. 13 is a schematic view of another embodiment for power scaling of this invention utilizing groups of fiber lasers doped with different active dopants that together provide an extended gain spectra and provision for additional generated wavelengths that may be WDM combined.

FIG. 14 is an illustration of the gain spectra for the fiber laser groups of FIG. 13.

FIG. 15 is a schematic view of a sixth embodiment for power scaling of this invention utilizing a novel dual core pumped fiber laser according to this invention.

FIG. 16 is a cross sectional view of the dual pumped core fiber laser shown in FIG. 15 taken along the line 16—16 in that figure.

FIG. 17 is a cross sectional view of the single pumped core fiber laser shown in FIG. 15 taken along the line 17—17 in that figure.

FIG. 18 is a schematic view of a further embodiment for power scaling of this invention utilizing time division multiplexing (TDM) of multiple fiber amplifiers.

FIGS. 19A and 19B are graphic illustrations of the utilizing the structure shown in FIG. 18 with time division multiplexing of multiple fiber amplifiers to provide a pulse outputs FIG. 20 is a graphic illustration of a further embodiment for power scaling of this invention utilizing the structure shown in FIG. 17 with time division multiplexing of multiple fiber amplifiers to provide a pulse output.

FIG. 21 is a schematic view of another embodiment for power scaling of this invention utilizing both the different wavelengths and different polarization modes of multiple fiber laser sources that are WDM and PBM combined.

FIG. 22 is a schematic view of a still further embodiment for power scaling of this invention utilizing, in addition, Raman pumped fiber lasers according to this invention.

FIG. 23 is a wavelength transmission band diagram for a Yb doped fiber laser with an illustration of Raman shifting of wavelength outputs for embodiment of FIG. 22.

FIG. 24 is an illustration of applications for the different embodiments of the fiber laser systems according to this invention.

FIG. 25 is a schematic illustration of another embodiment of this invention where the fiber gratings employed to stabilize the output of plural laser sources with the WDM device positioned between the source outputs to be combined and the fiber gratings formed in the output from the WDM device.

DETAILED DESCRIPTION OF THE PREFERRED EMBODIMENTS OF THE INVENTION

The following examples of embodiments and their discussion involving particular pumping sources in different configurations, different gain media, and particular wavelengths or polarization modes, and particular fiber dopants with specified gain spectra are intended to be only exemplary, as many different combination of these components can be visualized as is recognized by those skilled in this art. Also, different types of optical couplers may be employed in any one embodiment, where feasible, such as dichoric mirrors and directional couplers, such as fused fiber couplers, nxn fused fiber couplers, polished couplers and D-fiber couplers.

Reference is now made to FIG. 1 which illustrates a first embodiment of this invention for scaling the output power of fiber gain sources, in particular double clad fiber sources, such as double clad fiber amplifiers and lasers, through the employment of the available bandwidth of these fiber gain sources. As shown in FIG. 1, a power scaling fiber laser system 10 comprises a plurality of double clad fiber lasers 14, $L_1, L_2 \ldots L_n$ having optical feedback means in the form of cavity end mirrors 13 and output transmission fiber gratings 16, $G_1, G_2 \ldots G_n$. As is well known in the art, other forms of feedback mechanisms and their combinations may be employed to establish a resonant lasing cavity in each of the fiber lasers 14. For example, mirrors 13 may be used at both end of fiber lasers 14 with the output mirror coated with a wavelength filter to pass light of a wavelength different from that of adjacent fiber lasers. However, in improving the scaling of power capabilities, it is preferred that a fiber grating be employed to provide for selective wavelength separation into a larger number of possible different outputs for a given gain spectra of a chosen active dopant utilized for the plural fiber laser sources 14 in system 10.

Fiber lasers 14 may be single mode although multimode or double clad fibers are preferred in order to achieve higher output power. Fiber lasers 14 are provided with an active dopant in their pumped monomode cores, such as rare earths of neodymium ($Nd^{3+}$), ytterbium ($Yb^{3+}$), erbium ($Er^{3+}$), thulium ($Tm^{3+}$), or holmium ($Ho^{3+}$) doped fiber cores or codoped combinations thereof such as a combination of erbium and ytterbium ($Er^{3+}$: $Yb^{3+}$) doped core, with a pump core or inner cladding that has circular or noncircular symmetry, such as rectangular geometry. Yb doped fiber lasers are preferred over Nd doped fiber lasers because of the larger gain spectrum of Yb material which is homogeneously broadened, or Yb material as combined with other rare earth materials, such as Er:Yb. Thus, other preferred choices are Er doped fiber lasers and Er:Yb doped fiber lasers. Different fiber lasers 14 may be doped with different rare earth dopants as long as the combined outputs of each of the lasers are of all different wavelengths.

Pump sources 12, $P_1$, $P_2$ ... $P_n$ provide pump light input to each of fiber lasers 14 and may be comprised of one or more high power, semiconductor laser sources, such as a high power single emitter laser diode or a multi-emitter laser array. The output wavelength of the pump sources are selected as a function of the absorption band of the active dopant of the fiber lasers 14. Also, pump sources may be comprised of such a high power, semiconductor laser sources providing pump input to a fiber laser which, in turn, is provided as the pump input to a respective fiber laser 14 of system 10. In any of these cases, the pump radiation is launched directly into the pump core or inner cladding of the double clad fiber laser 14.

A unique but critical aspect of power scaling system 10 is that the output wavelength of each fiber laser 14 is controlled by a fiber Bragg grating 16 at its output, formed in the fiber by conventional ultraviolet light phase masking or plural beam interference techniques. Gratings 16 to provide a designated wavelength selection from the respective fiber lasers within the absorption bandwidth of the particular rare earth dopant provided in the fiber core of fiber lasers 14. The use of fiber gratings 16 is an important aspect of this invention because the desired reflected and resulting resonant cavity and transmission wavelength established can be accurately determined to 0.1 nm employing the ultraviolet phase masking or plural beam interference process for creating the grating periodicity that is capable of being used on mass production basis. The suggestion of fiber lasers as wavelength multiplexed pump sources for amplifiers has been disclosed in the past, as mentioned in the Background with regard to Huber U.S. Pat. No. 5,187,760. However, in this reference, the fiber laser pump sources are not stabilized in wavelength at their output with an in-line fiber Bragg grating, such as is the case here so that, as a consequence, it is not possible to provide a plurality of pump sources narrowly spaced in wavelength. Huber discloses resonant cavities with mirrors, but there is no disclosure of fiber gratings for the purposes of wavelength stabilization. Without good wavelength stabilization, trying to achieve a narrow wavelength spacing would be impractical, as changes in wavelength would effect WDM combining efficiency. Achieving a narrow wavelength spacing is of crucial importance as the absorption cross-section of the employed active dopant, such as Er or Nd or Yb, drop off rapidly on either said of their peak absorption wavelength. Employing a narrower wavelength spacing between or among the plurality of fiber laser sources results in an application having higher conversion efficiency and lower noise figure, which are both highly desirable in many applications including optical signal communication systems.

The grating periods of fiber gratings 16, i.e., $G_1$, $G_2$ ... $G_n$, are selectively transmissive of different wavelengths $\lambda_1$; $\lambda_2$ ... $\lambda_n$ permissible within the gain spectrum of fiber lasers 14. For example, laser $L_1$ may operate at a wavelength of 1080 nm, $L_2$ at 1085 nm, $L_3$ at 1190 nm, etc., and $L_n$ at 1100 nm. The output from multiple fiber lasers 14 are combined through a wavelength division multiplexer (WDM) 18, such as a dichoric mirror or a n×n fused fiber coupler. If a fused coupler, for example, is employed as the WDM device, the output of the double clad fibers of lasers 14 need be fused to single mode fibers which are used in forming the coupler. System 10 may be combined with additional such systems with their outputs multiplexed together to form a single high power light output. The multiple wavelength outputs are combined, producing a high power multi-wavelength output on WDM coupled output monomode fiber 19. Such multiple wavelength outputs are particularly useful for applications such as for pumping a double clad fiber amplifier and for applications, such as material processing, that are insensitive to specific wavelength bandwidth operation. An example of the former application comprises fiber laser $L_1$ providing a wavelength $\lambda_1$=980 nm and $L_2$ providing a wavelength $\lambda_2$=1480 nm with their combined outputs 19 utilized for pumping an Er doped double clad fiber amplifier employed for amplifying a 1.55 $\mu$m signal. For an Er doped fiber amplifier, wavelengths presented by lasers $L_1$, $L_2$ ... $L_n$ within the range of 960 nm to 1000 nm (±20 nm of 980 nm) can be combined at WDM 18 for stimulated emission of the Er doped fiber amplifier. A technique for obtaining a 980 nm output from a Yb doped double clad fiber laser is illustrated in the patent to Stephen G. Grubb U.S. Pat. No. 5,530,710, which patent is incorporated herein by reference thereto. The Yb doped, double clad fiber laser may emit radiation in the wavelength range of 1060 nm to 1100 nm. However, with the employment of a thin second rare earth Sm doped cladding surrounding the Yb doped pumped core, emission of any wavelength within the 1060 nm to 1100 nm band can be eliminated or suppressed in favor of enhanced emission at 980 nm. This 980 nm emission, along with the 1480 nm emission, are provided, via WDM 18, to the pump core of the Er doped double clad fiber amplifier shown at 16 in FIG. 1 of U.S. Pat. No. 5,530,710.

Examples of the just mentioned applications are thermal applied applications such as thermal printers, material processing or marking such as laser cutting, and trimming and identification, and medical surgical applications such as tissue incision and cutting. The fiber laser system of FIG. 1 can provide power delivery in excess of 1 watt per source which are necessary for modern thermal printing systems. Such examples will be explained later in reference to FIG. 24.

By combining the power, for example, of tens of fiber lasers capable of power outputs of 10 to 20 watts of individual output power, several hundreds of watts (or kilowatts in the case of combined peak powers from pulsed applications of such systems to be explained later) of optical power can be delivered to monomode output fiber 19. However, there are concerns that present power handling capabilities of existing single mode fibers will not be able to handle such high power levels. A destructive effect presently described or identified as a "fiber fuse" has been observed to occur in transmission of high power levels of the order of several watts in single mode fibers. The effect is characterized by a bright visible light that propagates in a single mode fiber beginning at a point of its initiation back toward the laser source. Examination of the fiber after this effect has shown that the fiber core is partially or completely melted. The initiation of the fiber fuse effect is prevalent at such high powers in standard glass fibers with Ge, P or Al index raising modifiers. This effect is of particular concern relative to this invention since WDM combining via a single mode fiber WDM provides powers of tens of watts to several hundreds of watts to a single mode fiber core. Pure undoped silica fiber, however, is an ideal transmission media for fiber 19, i.e., single mode, pure $SiO_2$ core fibers, because these fibers exhibit highest laser damage threshold at high power laser radiation levels. Also, some WDM couplers 18 are typically made from germanosilicate fibers and likely also have an upper power limitation due to the fiber fuse effect. In the utilization of this invention, a single mode fiber 19 or WDM coupler 18 utilizing pure silica, undoped cores, in the case of a fused coupler, are preferred. Also, the cladding surrounding the single mode core may include a fluoride. The index profile in FIG. 2 is one such example of a preferred fiber for handling high power levels. The refractive index profile of the fiber includes index depressed, silica core fibers because the power handling capability is greatly improved. The fiber comprises a $SiO_2$ core 15 and an outer $SiO_2$ cladding 21 of substantially the same, relatively high refractive index. Between cladding 21 and core 15 is a depressed index cladding 17, such as, for example, a fluorine depressed cladding.

The wavelength separation between fiber lasers 14 capable of being WDM combined may be as low as about 1 nm to as high as about 20 nm or more. Narrow wavelength separation achieved through the fiber gratings is desired because more fiber sources can be multiplexed for a given doped fiber absorption band. However, when the wavelength separation is very small, there can be losses due to too much spectral width overlap between adjacent fiber laser sources. In the case of Yb doped cores for fiber lasers 14, the absorption bandwidth is available so that a power scaling system comprising twelve fiber lasers 14 with fiber gratings providing pass wavelengths in 5 nm increments is readily achievable. Also, the more combining of multiple fiber laser sources with different operating wavelengths to achieve greater power levels in a single output fiber, the greater the losses that can be encountered, such as SRS scattering. Therefore, in order to reduce such losses, it may be preferred to have sufficient spatial wavelength separation among the several fiber laser outputs so that the SRS loss mechanism substantially disappears or is substantially reduced. This sufficient spatial wavelength separation may be 20 nm or more.

Power scaling system 10 may be used even in applications that require a narrow spectrum of operation, such as in the case of frequency doubling applications through proper selection of spatial wavelength separation between fiber lasers 14 and with phase matching conditions provided in the nonlinear conversion device.

A further alternative embodiment to FIG. 1 is the employment of a plurality of fiber lasers having different fiber lengths, without the use of fiber Bragg gratings to obtain specific output wavelengths of light, so that different wavelengths will be achieved among the fiber lasers due to different levels of saturable absorption established in each laser governed by their fiber length. This approach can be applied relative to any fiber that contains a quasi-three level dopant. As previously mentioned, Yb doped fiber lasers are preferred because of its broadened homogeneity and the large gain spectrum of Yb material, for example between 1060 nm to 1120 nm, or its combination with other rare earth materials, such as in the case of Er. Er and Yb are three level systems and, therefore, exhibit saturable absorption. For Yb, the saturable absorption decreases with wavelength. At wavelength 1060 nm, the saturable absorption is very strong and decreases to near zero at 1120 nm. For a relatively long fiber capable of absorbing all the pump power, the operational wavelength of the Yb laser fiber will be relatively long, such as 1100 nm or more, due to the saturable absorption of shorter wavelength light at or near the output end of the fiber where the fiber is not strongly pumped (of course, provided that there is no pump source at that fiber end). However, if the fiber is shortened, the pump power at the output end of the fiber will naturally be higher. Consequently, the saturable absorption at shorter wavelengths will be lower and thereby forcing the fiber laser to operate at shorter wavelengths within the Yb gain bandwidth where the gain of the fiber is higher. Thus, in the embodiment shown in FIG. 1, fiber lasers 14 are provided without gratings 16, $G_1$, $G_2$ . . . $G_n$, and the fiber lengths of the respective fiber lasers $L_1$, $L_2$ . . . $L_n$ vary from one another in length to provide a plurality of fiber lasers 14 each operating at a different wavelength within the gain spectra of the rare earth materials employed. The outputs from these fiber lasers are combined via WDM 18. As a specific example, for 130 $\mu$m diameter Yb doped laser fiber, the wavelength for a 20 meter length is 1092 nm; for a 15 meter length is 1090 nm; for a 12.5 meter length is 1087 nm; and for a 10 meter length is 1086 nm.

It can be seen that the total available bandwidth for WDM combining can be increased by providing a plurality of fibers with different lengths thereby increasing the total available bandwidth of fiber lasers 14. This arrangement can be further optimized by increasing the pump power for each of the fiber lasers 14, such as, for example, by providing a pump reflector mirror or grating respectively at or within the fiber near its output end to reflect and return unused pump light, or by pumping the fiber laser from both ends, or by pumping the fiber with respective WDM combined pump sources at periodic locations along the fiber length.

An optimized configuration from the standpoint of providing the widest band-width WDM combining scheme would be comprised of a fiber array comprising fibers with different fiber lengths, with different pump power launching conditions, such as pump power launching at the fiber ends or along the length with more pump sources provided as the fiber lengths become shorter in length, and with pump power feedback provided through incorporation of pump feedback gratings at both ends of each fiber laser.

Alternatively, instead of fiber lasers 14, fiber amplifiers may be utilized with a plurality of pumping sources, i.e., gratings 16 are not utilized and, instead, pump sources $P_1$, $P_2$ . . . $P_n$ are provided to be different semiconductor high power light sources operating respectively at different wavelengths which wavelengths are all within the absorption band of the fiber amplifier. In FIG. 3, in scaled power system 10', pump sources $P_1$, $P_2$ and $P_3$ have respective output gratings $G_1$, $G_2$ and $G_3$ that provide for respective wavelength outputs $\lambda_1$, $\lambda_2$ and $\lambda_3$ that are combined via WDM device 18A. The output of device 18A is provided to amplifier 14A which has an active dopant core for amplifying the wavelength-combined pump source light providing an output on fiber 19 of high power. If amplifier 14A is a double clad fiber, then fiber 19 is provided as a single mode fiber which is fused to the output end of the double clad fiber.

The amplified, different wavelength outputs of amplifiers 14 are combined into a single high power output via WDM 18. Although only two amplifiers 14A and 14B are shown in FIG. 4, it will be evident to those skilled in the art that additional amplifiers may readily be employed and combined via a WDM device 18C. Fiber scaling system 10″ comprises two system legs 10A and 10B each respectively having a plurality of laser pump sources $P_1$, $P_2$ and $P_3$ and sources $P_4$, $P_5$ and $P_6$, with respective output gratings $G_1$, $G_2$ and $G_3$ and $G_4$, $G_5$ and $G_6$ providing six distinctive output wavelengths of radiation which are combined by respective WDM devices 18A and 18B. The outputs of WDM devices 18A and 18B are respectively coupled to fiber amplifiers 14A and 14B having active dopant cores for amplifying the wavelength-combined pump source radiation. The output of amplifiers 14A and 14B are then combined by WDM 18C as a single high power output on fiber 19, such as single mode, undoped silica fiber.

Another embodiment of this invention is shown in generic form in FIG. 5. FIGS. 6–8 are detailed examples of this form as applied to a fiber amplifier and the use of biconical fused couplers that provide for coupling of spatially close wavelengths. Fiber laser system 40 is a power scaling design utilizing a plurality of fiber laser sources 37, pumped by other pump sources, such as WDM combined laser diode sources on fiber 36, to provide a plurality of different wavelength outputs $\lambda_1$–$\lambda_8$ which are WDM combined in pairs forming a tree-like pattern at 39A and 39B and extending to a final combined pair of outputs, $\lambda_1$–$\lambda_4$ and $\lambda_5$–$\lambda_8$, at WDM device 41. Output transmission fiber gratings 38, as previously indicated, are fabricated employing the ultraviolet phase masking or plural beam interference technique and can be manufactured with better than 0.1 nm wavelength accuracy and are very stable with low insertion loss which makes them ideal for the application of this invention. The outputs of the plural fiber lasers 37 are combined employing a combination of WDM devices 39A which may be comprised of commercially available fused biconical couplers, such as from Canstar or IP Fiber Devices. The advantage of such a system is that the cascaded tree pattern permits a large amount of fiber laser wavelengths to be combined, as provided over the extended gain spectra of the doped fiber. Also, note that the requirement for WDM couplers decreases by a factor of two when moving down the tree pattern toward sources 37. As explained previously, the pump sources, which are not stabilized in wavelength, do not permit the utility of WDM combining a plurality of pump sources narrowly spaced in wavelength. The use of wavelength-stabilized pump sources allow the use of pump lasers with a very narrow wavelength spacing, such as low as 5 nm or less for fiber laser sources 37.

FIGS. 6 and 7 are detailed examples of scaling of pump sources, similar to FIG. 5, but are related to a particular application, which here is amplification of a communication signal. Fiber amplifiers with wavelength multiplexed pump sources have been disclosed in the past, as mention in the Background, relative to U.S. Pat. Nos. 5,185,826 and 5,287,216. However, in the disclosure of the embodiments in these references, the pump sources are not stabilized in wavelength and, as a consequence, it is not possible to provide a plurality of pump sources that are narrowly spaced in wavelength that can be readily combined to provide added optical power for signal amplification. The use of wavelength-stabilized pump sources as disclosed in the embodiments of FIGS. 1–7 allow the use of pump lasers with a very narrow wavelength spacing, such as low as 5 nm or less, such as for 980 nm semiconductor pump sources, whereas in the case of the above mentioned references, the narrowest spacing as exemplified in U.S. Pat. No. 5,287,216 is 29 nm. Without wavelength stabilization, trying to achieve a narrow wavelength spacing would be impractical, as unavoidable drift of the pump wavelengths would cause undesired fluctuations of the pump power reaching the amplifier. Thus, achieving a narrow wavelength spacing is of crucial importance as the absorption cross-section of the employed active dopant, such as Er, drop off rapidly on either said of their peak absorption wavelength. Employing a narrower pump wavelength spacing between or among the plurality of pump sources results in an application, such as in the case of a fiber amplifier, with higher conversion efficiency and lower noise figure, both of which are highly desirable in optical signal communication systems.

FIG. 6 is directed to scaled pump sources for signal amplification. Fiber laser system 100 comprises a high power Er doped fiber amplifier 108 pumped by four wavelength-stabilized laser diodes 102. Laser diodes 102 are 980 nm diodes which have a small band of possible wavelength outputs between about 970 nm to about 990 nm which are within the absorption band of amplifier 108 to amplify a signal at about 1550 nm launched into the amplifier at input 106. Each individual laser diode 102 is stabilized by a fiber grating, $G_1$–$G_4$, respectively, which provides feedback to the diode at a prescribed wavelength. In the case here, the peak wavelengths and, therefore, the outputs are, respectively, at $\lambda_1$=972 nm, $\lambda_2$=982 nm, $\lambda_3$=977 nm and $\lambda_4$=987 nm. Output transmission fiber gratings 104, as previously indicated, are fabricated employing the ultraviolet grating writing technique and can be manufactured with better than 0.1 nm wavelength accuracy and are very stable with low insertion loss which makes them ideal for this particular application. The outputs of the four laser diodes 102 are then combined employing a combination of WDM devices $C_1$, $C_2$ and $C_3$. WDM devices 105 may be comprised of commercially available fused biconical couplers. In FIG. 4, couplers $C_1$ and $C_2$ are designed to combine 972 nm wavelength with 982 nm wavelength, and 977 n m wavelength with 987 nm wavelength, respectively. Because the wavelength response of multiplexing couplers 105 is quasi-periodic, it is possible for the third coupler $C_3$ with a 5 nm wavelength spacing to multiplex the outputs of the first two couplers $C_1$ and $C_2$ into a single optical fiber. With an insertion loss of less than 0.5 dB per fiber coupler 105, it is possible to obtain close to 300 mW of total pump power from four standard 90 mW laser diodes 102. This combined output is then combined, via a standard 980 nm/1550 nm coupler $C_4$, to the 1550 nm signal input at 106 and together launched into Er doped fiber amplifier 108. With is configuration, a 1550 nm output signal of more than 20 dBm can be achieved.

The example of FIG. 7 differs from the example of FIG. 6 in that wavelength-multiplexed pump lasers 112 are launched at both ends of the rare earth doped fiber amplifier 118, i.e., they are counter propagating pumps. In the case here, a pump wavelength separation of only 2.5 nm can be achieved employing 5 nm multiplexing couplers 115 comprising couplers $C_1$ and $C_4$, similar to coupler $C_3$ in the embodiment of FIG. 6. The outputs of two 980 nm diode lasers 112 at a first or input end of amplifier 118, having respective output fiber gratings at peak wavelengths $\lambda_1$=976 nm and $\lambda_2$=981 nm, are combined via fused biconical coupler $C_1$. The output of coupler $C_1$ is coupled, via narrow band wavelength blocking filters 117, $F_1$ and $F_2$, to fiber amplifier 118 via optical coupler $C_2$ together with 1550 nm signal input at 116, and these inputs are launched into amplifier 118. The outputs of two other 980 nm diode lasers 112 at a second or output end of amplifier 118, having respective output fiber gratings at peak wavelengths $\lambda_1$=978.5 nm and $\lambda_2$=983.5 nm, are combined via fused biconical coupler $C_4$. The output of coupler $C_4$ is coupled, via narrow band wavelength blocking filters 117, $F_3$ and $F_4$, to amplifier 118 via optical coupler $C_3$. The key to this design is the presence of filters 117 which isolate the counter-propagating pump lasers from one another. Without filters 117, counter pumping lasers 112 would interact and tend to destabilize one another. As examples, filters 117 may be non-reflecting mode-converting Bragg gratings in dual-mode fiber capable of achieving the narrow bandwidths required for these filters. See the paper FB3 of Strasser et al., Optical Fiber Conference '97, which is incorporated herein by its reference. In case here, couplers $C_1$ and $C_4$ are designed to combine 976 nm wavelength with 981 nm wavelength and 978.5 nm wavelength with 983.5 nm wavelength, respectively. Couplers $C_2$ and $C_3$ are broadband 980 nm/1550 nm combining couplers. As to filters 117, filter $F_1$, is designed to block a 978.5 nm peak wavelength; filter $F_2$ is designed to block a 983.5 nm peak wavelength; filter $F_3$ is designed to block a 876 nm peak wavelength; and filter $F_4$ is designed to block a 981 nm peak wavelength. These filters block any counter propagating pump light which may de-stabilize the selected wavelength operation of the pump lasers via their output transmission fiber gratings.

The embodiments of FIGS. 6 and 7 may, of course, be extended to different numbers of pump lasers or to other types of rare earth doped fibers such as fiber amplifiers doped with Yb or Nd. Further, while these two embodiments relate to applications for high power fiber amplifiers, the same kind of pumping schemes can also be used for designing high power fiber lasers such as in the case illustrated in FIG. 1.

Reference is now made to another detail example of this invention comprising a power scaling system 800 which is illustrated in FIG. 8. Scaling system 800 comprises a plurality of double clad fiber lasers $L_1$, $L_2$, $L_3$ and $L_4$ indicated as laser devices 804, 806, 808 and 810, e.g., fiber lasers with Yb doped cores having a wavelength band of about 1060 nm to 1150 nm. Fiber lasers $L_1$–$L_4$ are respectively pumped by pump sources 802, i.e., $P_1$–$P_4$, which may, for example, be a high power laser diode, a laser diode array or a double clad fiber laser pumps. Each of the fiber lasers $L_1$–$L_4$ includes an optical cavity including appropriate feedback such a mirror 803 at one end of the cavity that is transparent to the pump light of pumps 802 in the forward direction but reflects that light in cavity in rearward direction. The other end of the laser cavities respectively includes a Bragg grating 814, 816, 818 and 820, each having a different transmission wavelength $G_1$, $G_2$, $G_3$ and $G_4$ while reflecting all other wavelengths back into the laser cavity. In the particular example here, all these transmission wavelengths are within the operating bandwidth of the Yb doped fiber lasers $L_1$–$L_4$. For example, fiber grating $G_1$ of laser $L_1$ is set for transmission of $\lambda_1$=1060 nm, fiber grating $G_2$ of laser $L_2$ is set for transmission of $\lambda_2$=1080 nm, fiber grating $G_1$ of laser $L_3$ is set for transmission of $\lambda_3$=1070 nm, and fiber grating $G_4$ of laser $L_4$ is set for transmission of $\lambda_4$=1090 nm. In pairs of fiber lasers $L_1$ and $L_2$; $L_3$ and $L_4$, the transmission wavelengths are provided to have about 20 nm wavelength spacing within the gain spectra of the Yb doped fibers or all together may be separated in wavelength of about 10 nm or less. The advantage of this wider wavelength separation of WDM combined pairs of fiber laser outputs of 20 nm or more is that it effectively reduces noise, particularly SRS scattering, which increases with increasing combine output power. This noise can be effectively eliminated between pairs but the availability of combining wavelength outputs with less than 20 nm wavelength separation, e.g., 10 nm or less, is still effectively accomplished throughout the power scaling fiber laser system.

The pairs of fiber lasers $L_1$ and $L_2$; $L_3$ and $L_4$ have their outputs combined through the employment of WDM couplers 822, 824, respectively. Such WDM couplers for this embodiment as well as other embodiments herein that utilize fused biconical couplers are commercially available, for example, from Canstar and IP Fiber Devices as well as others, capable of being set to couple and transmit different wavelength inputs of high power, such as 10 W or greater. These fused biconical couplers are made, relative to one example, by twisting two fibers together and fusing them at high temperature while drawing the fibers so that the cores narrow at the formed drawn-out region permitting mode expansion and mixing into the fiber core. In the case here of multimode fibers, the high order modes will easily interact with the core of the twisted adjacent fiber transferring optical power. The amount of transfer depends upon the degree of coupling, taper length at the point of coupling, and splitting ratio. Drawing of the twisted, heated fibers is terminated when the desired periodic variation of the splitting ratio with taper length is achieved. Since splitting ratio is wavelength dependent, different wavelengths of light presented at the two input ports of the coupler can be designed to be WDM combined. As an example, in FIG. 8, coupler 822 has a variation in the splitting ratio for wavelength combining of $\lambda_1$ and $\lambda_2$ as inverse transmission compliments at its respective ports 1 and 2 since the transmission in each arm of the coupler is periodic in wavelength according to the designed splitting ratio so that the optical power of the outputs from fiber lasers $L_1$ and $L_2$ are combined as $\lambda_1$ and $\lambda_2$ on port 1 of fused coupler 822, as shown in the spectral response diagram accompanying coupler 822 in FIG. 8. The same is true in the case of fused coupler 824 where its variation in the splitting ratio for wavelength combining of $\lambda_3$ and $\lambda_4$ as inverse transmission compliments at its respective ports 1 and 2, as shown in the spectral response diagram accompanying coupler 824 in FIG. 8. In turn, the outputs of couplers 822, 824 form limbs or inputs to fused biconical coupler 826 which has splitting ratio variations design for wavelengths at its port 1 and wavelength inverse transmission function $\lambda_3$ and $\lambda_4$ at port 2 so that the combined wavelengths and transferred power at its port 1, i.e., output 41 is $\lambda_1$, $\lambda_2$, $\lambda_3$ and $\lambda_4$, as shown in the spectral response diagram accompanying coupler 826 in FIG. 8.

It will be seen that upon examination of FIG. 8, fused biconical couplers of the type illustrated at 822, 824 and 826 can be cascaded in a tree-limb fashion back toward fiber laser sources $L_1$–$L_4$ so that any number of such sources operating at different wavelengths within the operating wavelength band of the rare earth dopant utilized can be WDM coupled employing the combining technique provided by these fused biconical couplers. The result is that the outputs of a plurality of fiber lasers, each having a different wavelength, are WDM combined to provide a single output of high power and brightness. To be noted is that the requirement for WDM fused couplers decreases by a factor of two as one progresses rearward toward laser sources $L_1$–$L_4$.

In previous embodiments, mention has been made of the use of fused biconical couplers such as in the cases of FIGS. 6, 7 and 8. Such couplers can also be designed so as to have a transmission band to permit passage of a narrow band of light, wavelengths falling with the band. In FIG. 9, fused biconical coupler 130 comprises two undoped silica core fibers $B_1$ and $B_2$ which have been either aligned together or twisted together, then pulled and heated to fuse them together. In FIG. 9, they are shown aligned and then fused and pulled together. With a proper variation of the splitting ratio, which is dependent upon the degree of coupling and taper length, a port-to-port transfer can be provided where the transmission peaks, $\lambda_1$ and $\lambda_2$, are extended such as about ±10%, as illustrated at 132 in FIG. 9 for respective wavelength bands of $\lambda_1$ and $\lambda_2$. Thus, coupler 130 provides for a transmission function of a bandwidth of wavelengths $\lambda_1$ and $\lambda_2$ about the center wavelength with reasonable, high level coupling efficiency of about ±10% of the designated center wavelength.

Reference is now made to FIG. 10 to highlight further advantages in employing fiber laser pump sources which are WDM combined dealing with their replacement. Fiber laser system 120 comprises a plurality of semiconductor or fiber laser sources 122 each having a coupled transmission output fiber grating 124 respectively providing output wavelengths of $\lambda_1$, $\lambda_2$ and $\lambda_3$, which are WDM combined via WDM device 127, producing a single output on fiber 128, which output is applied to application 129. Sources 122 can also be a plurality of semiconductor laser diodes or arrays. In the case here, however, quick connect/disconnect, optical connectors 126 are provided in the optical fiber lines between gratings 124 and WDM device 127. If catastrophic or other damage befalls any one of fiber laser sources 122, the damaged source can be removed in the field and replaced with a source operating with the same wavelength grating 124 or at least operating with a wavelength output differing from any other of the sources 122. In order to remove any necessity of matching preexisting wavelength sources or provide a laser source 122 that has an appropriately different wavelength output for WDM combining along with the other remaining sources 122, the source grating can be permanently positioned between the couplers 126 and WDM device 127 at 125 so that the appropriate grating does not become a required decision making factor as to what wavelength transmission is acceptable for WDM device 127 as long as the substituted fiber laser source 122 has a gain spectrum matching the in-line grating wavelength of fiber grating 127. This is a particularly good quick-connect application utilizing permanently in-place fiber gratings because of their proven high environmental stability over time. It should be noted that in FIG. 10, either grating 124 exists or grating 125 exists at the output of any particular source 122, i.e., these gratings obviously do not exist in pairs.

Also, it should be noted that a quick connect/disconnect coupler 126 may also be placed in output fiber 128 so that the whole power scaling unit comprising WDM combined sources 122 can be replaced due, for example, to failure.

Lastly, if application 129 is wavelength sensitive to a particular wavelength bandwidth, a broadband fiber grating may be formed in output fiber 128 to select the transmitted bandwidth of desired wavelengths.

A specific application 129 in FIG. 10 may be, for example, power scaling of an inner cladding pumped double clad fiber MOPA structure of the type shown, for example, in U.S. Pat. No. 5,473,622 to Stephen G. Grubb, which is incorporated herein by its reference. Moreover, the different wavelength outputs of a plurality of such fiber MOPA devices, such as shown in either FIGS. 2, or 4 of that patent, whether individually pumped by one or pumping sources combined in the manner as explained herein, can be WDM combined to provide a single high power output on a single mode fiber employing WDM devices to combine their respective outputs together.

Reference is now made to FIG. 11 which discloses another embodiment of this invention comprising fiber laser system 140. System is basically the same as system 10 illustrated in FIG. 1 in that a plurality of fiber lasers 142 have in-line fiber gratings 144 for providing stabilized outputs of peak wavelengths of $\lambda_1$, $\lambda_2$ and $\lambda_3$ for WDM combining at WDM device 146 forming a single output on fiber 147 for coupling to an application 148. The difference, however, is that in-line fiber gratings 144 are chirped gratings having a periodic bandwidth sufficiently narrow to permit sufficient WDM combining of the outputs of the fiber lasers but a sufficiently wide bandwidth in order that the individual beams will be of low noise in order to meet the requirements of an intended application 148. These chirped gratings may be about 1 cm long, for example and have a wavelength sensitivity of up to several nanometers. Chirped gratings 144 selectively provide for transmission of a narrow bandwidth of wavelengths for WDM combining in a manner similar to the wavelength bandwidths 132 in FIG. 9 except they have a bandwidth of a smaller scale.

In the previous discussion of FIG. 9 above, a fused biconical coupler 130 was illustrated for WDM combining of a plurality of radiation wavelengths. Rather than using a fused coupler, another WDM combining approach is the employment of a grating mirror as shown in FIG. 12. WDM combiner 150 comprises a grating mirror 156 which has a grating reflector surface 158. Light beams from a plurality of laser sources 152–155, which may have the same gain spectra, are positioned at different angles relative to the planar extent of surface 158. Output beams 152A–155A from laser sources 152–155, albeit semiconductor laser or fiber lasers, are angularly directed onto grating surface 158 at a given point where they are reflected together at the same angle from surface 158 forming a single output beam 157 which may be coupled into a single mode fiber (not shown). Thus, the angular positioning of sources 152–155 relative to planar surface 158 is wavelength determinative of their particular output beams. Partial mirror 159 provides for a portion of the light of the respective wavelengths to be reflected back to laser sources 152–155. Thus, because of the different angles and path lengths taken by the respective beams from these sources, they will all lase at different wavelengths, $\lambda_1$, $\lambda_2$, $\lambda_3$ and $\lambda_4$. The angular degree between the angularly positioned sources 152–155 is small, such as a few degrees, to achieve a 5 nm wavelength spacing among the different wavelengths $\lambda_1$, $\lambda_2$, $\lambda_3$, and $\lambda_4$. This arrangement is similar to that shown in U.S. Pat. No. 5,379,310 to Papen et al. but differs in not combining the output beams for power scaling into a single output beam as well as the manner of establishing wavelength feedback in the zero order which is also the output beam order.

Alternatively, in the case of fiber lasers comprising sources 152–155, the fiber lasers are stabilized in wavelength, $\lambda_1$, $\lambda_2$, $\lambda_3$ and $\lambda_4$, with individual fiber gratings written in each of the fiber lasers. Their outputs are then WDM combined with a single mirror grating 158 as illustrated in FIG. 12. In this alternative, feedback mirror 159 is not required.

Reference is now made to FIGS. 13 and 14 illustrating a further of this invention. Fiber laser system 160 comprises two groups or sets of fiber lasers 163, $L_{A1} \ldots L_{An}$, and fiber lasers 165, $L_{B1} \ldots L_{Bn}$, with fiber gratings 161 and 167 with the fiber laser wavelength outputs established via fiber gratings 166 and 168, which wavelengths are within the gain spectrum of lasers 163 and 165, respectively. The different wavelength outputs of fiber lasers 163 and 165 are WDM combined via respective WDM devices 169 and 170. Fiber lasers of set A are pumped by laser sources 162 whereas fiber lasers of set B are pumped laser sources 164. Fiber lasers of set A comprise a first rare earth dopant or dopants that has a first gain spectrum, $A_1$–$A_n$, as illustrated in FIG. 14 whereas fiber lasers of set B comprise a second rare earth dopant or dopants that has a second gain spectrum, $B_1$–$B_n$, as illustrated in FIG. 14 wherein the gain spectra of sets A and B are overlapped or are adjacent to one another forming together an extended single gain spectrum 173. Pump sources 162 have wavelength outputs within the absorption band of fiber lasers 163 and pump sources 164 have wavelength outputs within the absorption band of fiber lasers 165. The combined outputs from WDM devices 169 and 170 are combined by WDM device 171 providing a single high power output at 172 in the tens to hundreds of watts.

Reference is now made to another embodiment of this invention illustrated in FIGS. 15–17. This embodiment comprises power scaling system 42 and is similar in concept to power scaling system 800 of FIG. 8 except that different wavelength pump laser sources for pumping double clad fiber lasers are combined via WDM. The double clad fiber lasers may be comprised of a double core configuration comprising two concentric single mode cores surrounded by a pump cladding core to provide higher power output from a single double clad, dual core fiber laser compared to the employment of a single double clad fiber laser.

In FIG. 15, a particular example of an embodiment is shown although other different configurations can be readily envisioned by those skilled in the art. Power scaling system 42 ,may comprise a Nd:Yb doped, double clad, dual core fiber laser 45 having an optical cavity as defined gratings 46A, 46B with an emission wavelength of $\lambda_A$=1060 nm, for example, and a Yb doped double clad fiber 47 having optical cavity as defined gratings 48A, 48B having an emission wavelength of $\lambda_B$=1080 nm, for example.

As shown in FIG. 16, fiber laser 45 has dual single mode cores comprising Nd doped, inner core 51 and outer Yb doped, concentric core 52, each of the same refractive index or substantially similar refractive index, which is surrounded by a substantially rectangular shaped, inner pump cladding 53 having a refractive index lower than that of cores 51, 52 and having a NA compatible with the NA of the pump laser sources 43A, 43B. An outer cladding 54 and fiber sheath (not shown) are formed on pump cladding 53. The total diameter of both inner and outer cores 51, 52 may be $D_1$ equal to about 7 μm to 8 μm forming a single mode dual core. As a specific example, the inner Nd core 51 may about 4 to 5 μm and the outer Yb core 52 may be about 2 to 4 μm. The inner core 51 may be larger than the outer core 52 and visa versa but together they are single mode. Also, Nd can be in outer core 52 and Yb in inner core 51. Other rare earths can be employed in place of either of these active elements or a core may be co-doped with active elements such as Er:Yb. Pump cladding 53 may be, as an example, W equal about 250 μm to 370 μm and H equal to about 100 μm to 200 μm.

As shown in FIG. 17, fiber laser 45 has an Yb doped, inner core 55 having a high refractive index, surrounded by a substantially rectangular shaped pump core 56 having a refractive index lower than the refractive index of core 56 and a NA compatible with the NA of the pump laser sources 43C, 43D. An outer cladding 57 and fiber sheath (not shown) are formed on pump core 56. Fiber laser 45 is pumped with at least two semiconductor lasers or laser arrays 43A, 43B having respective output wavelengths of around $\lambda_1$=810 nm and $\lambda_2$=915 nm or 980 nm, the former being within the absorption band of Nd and the latter being with the absorption band of Yb. A multiplicity of pump sources may be WDM combined at each pump band. By using a double core with respective rare earth dopants, two pump bands are available increasing the total amount of pump power that can be WDM combined into a single mode fiber. Outputs of pump sources 43A, 43B are combined via WDM device 44A (e.g., a dichoric mirror or a directional coupler) and are provide as pump input to fiber laser 45 via pump cladding 53. In the case of fiber laser 47, at least two semiconductor lasers or laser arrays 43C, 43D are WDM combined with WDM device 44B and are provided as pump input to fiber laser 47 via pump core 56. Laser sources 43C, 43D have respective output wavelengths of $\lambda_3$=915 nm and $\lambda_4$=975 nm, which are both within the absorption band of Yb.

Two differently doped fiber lasers 45 and 47 Nd:Yb dual core doped and Yb single core doped) are illustrated here to show how the gain bandwidth can be widened and, correspondingly, increase the number of possible different wavelength fiber lasers that can be WDM combined via WDM device 49 comprising, for example, a fused biconical coupler providing the combined power outputs of both fiber lasers 45 and 47 at output 50.

Reference is now made to FIG. 18 which shows a further embodiment of this invention for power scaling output power employing a plurality of fiber amplifiers $A_1$, $A_2$ . . . $A_n$, only two of which are shown here for purposes of illustration. Power scaling system 20 comprises a plurality of amplifiers 26, $A_1$, $A_2$, etc., which are double clad fiber cores doped or codoped with rare earth dopants. The different wavelength outputs, $\lambda_1$, $\lambda_2$ . . . $\lambda_n$, of signal sources 24 are coupled into the cores of fiber amplifiers 26 via beam combiner 25 while the pump radiation from pump sources 22 is launched into the pump core of double clad fiber amplifiers 26 via beam combiner 25. Signal sources 24, $S_1$, and $S_2$, are modulated, as illustrated in FIG. 19A, to provide opposing mirrored pulse output and which are then amplified by amplifiers 26. Modulated wavelength, $\lambda_1$, $\lambda_2$ . . . $\lambda_n$, outputs are combined via time division multiplexer (TDM) 28 in a manner that the respective modulated outputs of amplifiers $A_1$, $A_2$ . . . $A_n$ are time-width combined to produce a cw output as shown in FIG. 19B. TDM 28 may be comprised of, for example, an acousto-optical switch, or an oscillating mirror or prism.

An important feature of this embodiment in FIG. 18 is that by means of high pulse rate modulation of signal sources 24, large peak powers can be achieved, which when amplified by fiber amplifiers 26 and time multiplex to provide a cw output 29, provide a highly effective scheme for producing a very high output power, particularly for applications not sensitive to very small fluctuations in the combined, total cw output. The peak power in each fiber amplifier 26 is twice the average power available from fiber amplifiers 26 because of the energy storage capacity of the fiber amplifiers. Pulse lengths for the signal source outputs shown in FIG. 19A may range from several microseconds to several nanoseconds. Lower modulation rates are advantageous for providing simple low speed switching via TDM 28. A pump system such as source 24 and amplifier 26 that may be used with this invention are disclosed in FIG. 1 or FIG. 14 of U.S. patent (Ser. No. 08/588,747, filed Jan. 19, 1996) and in U.S. Pat. No. 5,657,153, both of which are commonly owned by the assignee herein and are incorporated herein by their reference.

FIG. 20 graphically illustrates a further embodiment employing power scaling system 20 of FIG. 18 for producing a continuous train of high power pulses rather than a cw output described in connection with FIG. 18. In this configuration, the respective modulated outputs 30 and 32 of sources $S_1$, and $S_2$ are received at TDM 28 which time multiplexes the asynchronous amplified outputs to produce the pulse train 34 shown for output 29 in FIG. 20. In this alternate embodiment, the switching rate of TDM 28 may be relatively slow while producing a total high frequency pulse stream at output 29.

The particular output operation provided in the embodiments of FIGS. 18–20 are particularly advantageous for thermal printer operation which are more efficient at high peak power levels of operation which is capable of being provided by these power scaling systems. This is because these kind of thermal print operations generally have high thermal diffusion constants requiring short pulse of high incident peak powers to meet the desired diffusion constants. However, the scaling of power of embodiments are also applicable to other applications as well as printing and marking applications as depicted in FIG. 24. The fiber laser system of any of these foregoing embodiments may be provided as a single output on a flexible fiber, such as a single mode, undoped silica fiber, for coupling the high power output from the fiber laser system to a movable carriage 202 of a printer, marker or thermal processing beam delivery device 200 as depicted in FIG. 24. The carriage may support a print or marking head for receiving the high power multiwatt output light beam for directing the beam to application 204 as the carriage 202 is moved relative to application 204, such as moved transversely with respect to the application. For this kind of application, a single mode fiber 206 is sufficiently flexible to moved relative to device 200 to provide for flexible beam delivery from fiber laser system 208. Such a single mode flexible fiber removes speckle and noise feedback providing a stable radiation intensity delivery system. Examples of applications are light sensitive mediums in a thermal or xerographic printer systems; or in material processing, such as, cutting, welding and hole fabrication in metals and alloys; or thermal heat treatment via a scanned beam across a surface to be heat treated to provide functions of surface layer removal or surface annealing; or in surface marking such as in surface tattooing or writing. The outputs, for example, of at least two double clad fiber lasers with power outputs of about 1 watt or more may be WDM combined into a single fiber output. The use of a single mode fiber with such high power levels in the tens of watts has the advantage of providing single mode, high beam quality allowing for a large depth of focus useful in these types of applications as will be appreciated by those skilled in the art.

Reference is now made to FIG. 21 illustrating another embodiment of this invention. Fiber laser system 180 for providing power scaling includes the combination of wavelength combining of radiation via wavelength division multiplexing (WDM) with polarization beam combining of radiation via polarization beam multiplexing (PBM). PBM is another manner of combining radiation into a single output. This principle is known in the art, as previously indicated relative to the patent to Pantell et al. U.S. Pat. No. 5,311,525 wherein in column 14, there is a discussion of such optical devices for coupling of optical energy or radiation between two different sets of polarized radiation modes, such as the x and y polarization modes for fundamental or second order modes of either $LP_{01}$ or $LP_{11}$. However, in FIG. 21, a combination of WDM and PBM is illustrated in fiber laser system 180 comprising two legs, a first leg comprising a plurality of fiber lasers 182 with respective inline output fiber gratings 183 and a second leg comprising a plurality of fiber lasers 184 with respective in-line output fiber gratings 185. Fiber lasers 182 are coupled to a first WDM device 186 and fiber lasers 184 are coupled to a second WDM device 187. A primary difference between the first and second leg groups is that the wavelengths of respective leg groups are orthogonally polarized. A x-polarized $LP_{01}$ mode is prevalent in the first leg of system 180 which is maintained with the use of polarization maintaining fibers for fiber lasers 182, such as with a polarizing element providing a small loss induced for one polarization by means of a short piece of polarizing fiber, or polarization maintaining fibers for the coupling fiber between lasers 182 and WDM device 186 containing fiber gratings 183. On the other hand, a y-polarized $LP_{01}$ mode is prevalent in the second leg of system 180 which is maintained with the use of polarization maintaining fibers for lasers 184, such as with a polarizing element providing a small loss induced for one polarization by means of a short piece of polarizing fiber, or polarization maintaining fibers for the coupling fiber between lasers 184 and WDM device 186 containing fiber gratings 185. The outputs of WDM devices 186 and 187, therefore, contain a plurality of combined wavelengths $\lambda_{T1}$ and $\lambda_{T2}$ with respective x and y polarized $LP_{01}$ modes in polarization maintaining (PM) fibers 188 and 189. PM fibers 188 and 189 are coupled to polarization beam combiner 190 which PBM combines the polarized mode leg sets of wavelength outputs as a single output on fiber 191.

In the description of the previous embodiment, reference has been made to fundamental order polarization modes. However, fundamental order modes or second order modes or first order modes per se can be respectively PBM combined such as the combinations of horizontal, vertical circular or radial polarization modes.

Reference is now made to a further embodiment of this invention illustrated in FIG. 22 comprising power scaling system 60. System 60 is similar to power scaling system 10 in FIG. 1 except that the bandwidth of combined fiber laser sources is increased through the use of Raman lasers either in the form of a single Raman fiber laser that provides a Raman shift or a series of coupled Raman shift fiber lasers providing a plurality of Raman shifts. An exemplary Raman laser is shown in FIG. 1 of U.S. Pat. No. 5,323,404 to Stephen G. Grubb, and in the article of Stephen G. Grubb et al. entitled, "1.3 µm Cascaded Raman Amplifier in Germanosilicate Fibers", Paper PD3, Optical Amplifiers and Their Applications, Technical Digest, Optical Society of America, Washington, D.C. (1993), which references are incorporated herein by reference. As in the case of system 10, a plurality of fiber lasers, such as Yb doped fiber lasers 62A, 62B, pumped by semiconductor or fiber pump light sources 61A, 61B, provide power output of different wavelengths determined by respective fiber gratings 64A and 64B, here shown as separate by 10 nm, respectively, 1110 nm and 1120 nm, which are within the gain bandwidth of Yb, as indicated at 69 in FIG. 23. Thus, for the purposes of this explanation, Yb fiber lasers 62A, 62B are two such lasers that may be utilized in the possible combinations from the Yb gain bandwidth 69 (FIG. 23), which has a bandwidth of around 100 nm. In order to increase this bandwidth further so as to provide additional fiber laser outputs for WDM combining, Raman shifting of wavelengths within band 69 can be utilized which is exemplified in conjunction with Raman fiber lasers 63A and 63B of FIG. 22. For example, Yb doped fiber laser 62C, pumped by semiconductor or fiber pump source 61C, has a fiber grating 64C set for a wavelength of about 1100 nm. The output of laser 62C is fusion spliced to Raman laser 63A comprising a single mode fiber similar of the type shown in the above mentioned article of Grubb et al. and having refractive index fiber grating pairs 65A, 65B and 66A, 66B with center wavelengths respectively at 1130 nm and 1160. These gratings are all highly reflective except that grating 66B permits substantial transmission of wavelength light at 1060 nm. Gratings 65A, 65B at center wavelength 1130 nm provide for internal reflected and buildup for stimulation of light generation at center wavelength 1160 nm. The 1160 nm output at 61D from Raman laser 63A can be, in turn, provided as input 61E to another Raman laser 63B to provide a second Raman shift of the input wavelength light. Raman laser 63B includes refractive index fiber grating pairs 67A, 67B and 68A, 68B with center wavelengths respectively at 1190 nm and 1220 nm. Gratings 67A, 67B at center wavelength 1190 nm provide for internal reflected and buildup for stimulation of light generation at center wavelength 1160 nm with output from highly transmissive grating 68B of light at 1220 nm. Effectively, the Raman shifted outputs of Raman lasers 63A and 63B are provided to a WDM device for WDM combining and ultimately on a single output as combined with other different wavelength outputs in FIG. 22. Thus, the wavelength band can be effectively expanded, as illustrated in FIG. 23, to additional shifted wavelengths beyond the gain bandwidth 69 for Yb for additional WDM combining for power scaling applications or other applications requiring a plurality of different wavelengths. The Raman shift of Raman laser 63A is indicated at line 69A in FIG. 23. Additional Raman shifts can be attained in the same manner as previously indicated using multiple Raman laser stages, for example, by the Raman shift from 1110 nm, such as from Yb fiber laser 62A, to 1170 nm, indicated by line 69B, which may be further Raman shifted as indicated at line 69D in FIG. 23. The second Raman shift provided by Raman laser 63B is indicated at line 69C in FIG. 23.

Reference is now made to FIG. 25 which discloses a further embodiment of this invention. In FIG. 25, laser sources 252, which may be semiconductor lasers (e.g., DFB, α-DFB or DBR lasers) or fiber lasers (e.g., double clad fiber lasers), produce light of different wavelengths, here $\lambda_1$ and $\lambda_2$, which are WDM combined via wavelength division multiplexer device 253 to produce a common output on fiber output line 256. In output line 256 are broad band fiber gratings 254, $\lambda_{B1}$ and $\lambda_{B2}$, which are respectively partially reflective of light from laser sources 252, $\lambda_1$ and $\lambda_2$. Each fiber grating 254 thus receives the light from a respective source via WDM device 253 to stabilize its wavelength of operation to a narrow linewidth output at a wavelength different from the wavelength output of the other laser source or of any other laser source. The difference in this embodiment from previous embodiments is that WDM device 253 is coupled between laser sources 252 and broad band fiber gratings 254 which enhances the stabilization of laser sources 252. Over time or during operation, WDM device may change in characteristics due to, for example, aging and ambient changes, such as temperature, so that polarization and/or wavelength preset response conditions shift from the prescribed polarization or wavelength conditions of sources 252. If the stabilization gratings for sources 252 are positioned between the output of these sources and the WDM device, polarization and/or wavelength response shifts of the WDM device from its original setting conditions will not be as responsive in combining all of the light output of laser sources 252. As a result, there will be higher losses experienced in the combined output of light on line 256. To correct for this condition, broad band fiber gratings 254 may be employed, which are positioned, not at the output of sources 252, but rather at the output of WDM device 253. Thus, if any polarization or wavelength response shifts, due to aging or environmental effects on WDM device 253, occur, then respective laser sources will automatically seek optimal polarization and wavelength operation within the respective bandwidths of fiber gratings 254 leading to enhanced operating stabilization of laser sources 252 in spite of WDM device response shifts over time. As a result, optimum efficiency of light combining from sources 252 is continually maintained.

Fiber gratings 252 may be periodic or chirped, such as shown in FIG. 11, providing for a larger broader bandwidth response. WDM device 253 may be a directional coupler or other type of combiner sensitive to aging and environmental changes, such as dichoric mirror couplers or a multiple (n×n) fused fiber coupler. Also, the structure of FIG. 25 may be utilized in other embodiments of this invention, such as, for example, FIGS. 1, 4, 5, 6, 8, 10, 13 and 21, in multiple form for the multiple coupling of a plurality of different wavelength outputs.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as that are within the spirit and scope of the following claims.

What is claimed is:

1. A marking system comprising:

a plurality of laser sources comprising a plurality of fiber lasers;

said plurality of fiber lasers operating at different wavelengths with their respective outputs coupled into a respective single mode fiber;

at least one wavelength division multiplexing (WDM) device coupled to receive and combine said laser source outputs into a single output;

a marking medium;

said wavelength multiplexed single output having sufficient power intensity to induce thermal marking on said medium.

2. The marking system of claim 1 wherein said thermal inducement comprises one of thermal ablation, thermal fusion, thermal diffusion and thermal transfer.

3. The marking system of claim 2 wherein said marking system is a thermal printer and said marking medium is a thermally responsive medium to said single output.

4. The marking system of claim 1 wherein said single output is provided in one of a single mode fiber and a multimode fiber.

5. The marking system of claim 4 wherein said single output fiber is flexible for coupling and relative movement relative to said medium.

6. The marking system of claim 1 wherein each of said plurality of fiber lasers is capable of providing output power of at least 1 W.

7. The marking system of claim 1 wherein said lasers provide said single output in a single mode fiber in excess of 1 W.

8. The marking system of claim 1 further comprising wavelength selection means in each of said laser sources.

9. The marking system of claim 8 wherein said wavelength selection means is a fiber grating.

10. The marking system of claim 1 wherein each of said plurality of fiber lasers comprises single mode fiber and said WDM device is a fused conical coupler.

11. The marking system of claim 1 wherein said lasers provide said single output in a single mode fiber, said single mode fiber movable relative to said marking medium to provide for flexible beam delivery.

12. The marking system of claim 11 wherein said single mode flexible fiber removes speckle and noise feedback providing a stable radiation intensity delivery system.

13. The marking system of claim 1 further comprising a quick disconnect coupler between said WDM combiner and at least one of said laser sources for replacement in an event of its failure.

14. The marking system of claim 1 wherein each of said plurality of fiber lasers is one of single mode fiber laser and multimode fiber laser.

15. The marking system of claim 1 wherein each of said plurality of fiber lasers is provided with an active dopant core.

* * * * *